(12) United States Patent
Takahashi et al.

(10) Patent No.: US 7,498,809 B2
(45) Date of Patent: Mar. 3, 2009

(54) MAGNETIC RESONANCE IMAGING DEVICE WITH MULTIPLE RF COILS APPLYING HALF-PULSE WAVEFORMS FOR SELECTIVE EXCITATION OF A LOCAL REGION

(75) Inventors: Tetsuhiko Takahashi, Soka (JP); Hiroyuki Takeuchi, Kashiwa (JP); Masahiro Takizawa, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/540,952

(22) PCT Filed: Dec. 24, 2003

(86) PCT No.: PCT/JP03/16560

§ 371 (c)(1), (2), (4) Date: Jun. 27, 2005

(87) PCT Pub. No.: WO2004/060156

PCT Pub. Date: Jul. 22, 2004

(65) Prior Publication Data

US 2006/0091884 A1      May 4, 2006

(30) Foreign Application Priority Data

Dec. 27, 2002  (JP)  ............................. 2002-379703
Jan. 8, 2003   (JP)  ............................. 2003-002038

(51) Int. Cl.
*G01V 3/00*        (2006.01)

(52) U.S. Cl. ........................ 324/309; 324/318; 324/307; 324/314

(58) Field of Classification Search ......... 324/300–322; 600/410, 411, 422
See application file for complete search history.

(56) References Cited

U.S. PATENT DOCUMENTS 5,041,791 A * 8/1991 Ackerman et al. .......... 324/318

(Continued)

FOREIGN PATENT DOCUMENTS

| JP | 5-269108 | 10/1993 |
|----|----------|---------|
| JP | 6-154187 | 6/1994 |
| JP | 2002-272705 | 9/2002 |

*Primary Examiner*—Diego Gutierrez
*Assistant Examiner*—Tiffany A Fetzner
(74) *Attorney, Agent, or Firm*—Cooper & Dunham, LLP

(57) ABSTRACT

An MRI apparatus suitable for realizing selective excitation utilizing multiple RF transmitting coils (parallel transmission) is provided. This MRI apparatus is provided with, as an RF receiving coil or RF transmitting coil, an RF transmitting coil 104 comprising a loop coil 210, primary differential coil 220 and secondary differential coil 230 having a common central axis 201. Upon imaging, the coils 210, 220 and 230 constituting the RF transmitting coil 104 are simultaneously driven by RF signals with the same phase, and only the differential coils 220 and 230 are driven in the second half of irradiation time with phases different by 180° from the phases for the first half. Alternatively, two times of measurements are performed as a pair, in which, in the first measurement, the coils 210, 220 and 230 are simultaneously driven with RF signals of the same phase, then in the second measurement, only the differential coils 220 and 230 are driven with phases inverse to the phases for the first measurement, and the signals measured respectively are added. Such imaging or addition of the results of two times of the measurement provides a profile for exciting a local region. This enables selective excitation of only a desired region without using any RF pulse for signal suppression.

17 Claims, 13 Drawing Sheets

U.S. PATENT DOCUMENTS

| | | | |
|---|---|---|---|
| 5,150,053 A * | 9/1992 | Pauly et al. | 324/309 |
| 5,187,439 A * | 2/1993 | Jensen et al. | 324/309 |
| 5,270,652 A * | 12/1993 | Dixon et al. | 324/309 |
| 5,412,321 A * | 5/1995 | Kohno et al. | 324/309 |
| 6,256,526 B1 * | 7/2001 | Butts et al. | 600/410 |
| 6,275,040 B1 * | 8/2001 | Zur | 324/320 |
| 6,307,368 B1 * | 10/2001 | Vasanawala et al. | 324/309 |
| 6,678,544 B2 * | 1/2004 | Butts et al. | 600/410 |
| 7,064,547 B1 * | 6/2006 | King et al. | 324/309 |
| 7,119,540 B1 * | 10/2006 | Shenoy et al. | 324/309 |
| 2001/0025141 A1 * | 9/2001 | Butts et al. | 600/410 |
| 2002/0111549 A1 | 8/2002 | Wang | |
| 2002/0167317 A1 * | 11/2002 | Shenoy et al. | 324/307 |
| 2004/0135579 A1 * | 7/2004 | Takizawa et al. | 324/309 |
| 2006/0091884 A1 * | 5/2006 | Takahashi et al. | 324/318 |

\* cited by examiner

FIG. 15(a)
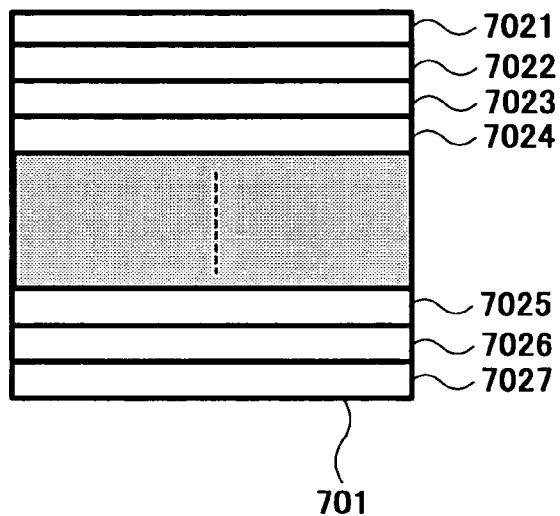
FIG. 15(b)
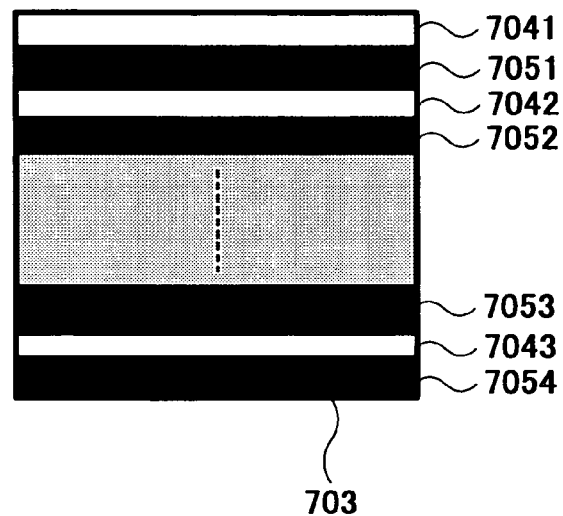
FIG. 15(c)
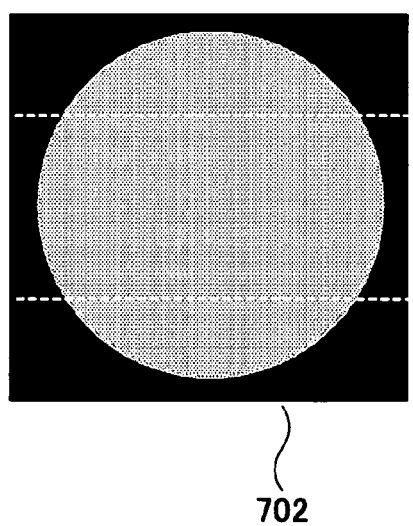
FIG. 15(d)

MAGNETIC RESONANCE IMAGING DEVICE WITH MULTIPLE RF COILS APPLYING HALF-PULSE WAVEFORMS FOR SELECTIVE EXCITATION OF A LOCAL REGION

TECHNICAL FIELD

The present invention relates to a magnetic resonance imaging (MRI) apparatus for measuring nuclear magnetic resonance (henceforth referred to as "NMR") signals from hydrogen, phosphorus and so forth of a subject and imaging nuclear density profile, relaxation time profile and so forth. In particular, the present invention relates to an RF multiple coil system suitable for parallel reception and parallel transmission and an MRI apparatus utilizing the same.

RELATED ART

Concerning MRI, for example, cardiac MRI and so forth, there is a demand of high speed and high resolution imaging of a small region. As a common technique for suppressing signals from unnecessary portions outside the field of view, there is the presaturation method (e.g., Japanese Patent Unexamined Publication (KOKAI) No. 7-327956). However, the presaturation method requires RF irradiation and a crusher or spoiler pulse besides pulses for imaging, therefore application time therefore is required, and thus the total imaging time tends to be prolonged. Such prolongation of the imaging time is problematic in imaging of, in particular, fast moving portions such as heart.

Further, techniques for selectively exciting a more limited region compared with the conventional slice selection utilizing a selective gradient magnetic field and RF pulse (two-dimensional selective excitation) have also been proposed in recent years. In one of them, for example, a limited space is excited by applying gradient magnetic fields for spirally scanning a k-space together with an RF pulse of a specific shape as described in "A k-Space Analysis of Small-Tip-Angle Excitation", John Pauly et al., J. Magnetic Resonance, 81, 43-56 (1989). However, in this method, the k-space is spirally scanned while the RF pulse is applied. Therefore, the gradient magnetic field pulses must be controlled at a high speed, and the RF pulse and the gradient magnetic field must be executed in special shapes.

Therefore, an object of the present invention is to provide an MRI apparatus that does not require presaturation or special control of gradient magnetic field pulse and enables effective selection of a field of view.

DISCLOSURE OF THE INVENTION

In the MRI apparatus of the present invention, the aforementioned object is achieved by performing specific irradiation phase control for the RF magnetic field. That is, the MRI apparatus of the present invention comprises a transmitting means for applying an RF magnetic field to a subject placed in a static magnetic field, an RF irradiation control means for controlling irradiation phase of the RF magnetic field, a receiving means for detecting nuclear magnetic resonance signals generated from the subject, a control means for controlling the transmitting means, the RF irradiation control means and the receiving means, and an image formation means for reconstructing an image of the subject by using the nuclear magnetic resonance signals, and the MRI apparatus is characterized in that the RF irradiation control means controls RF irradiation so that the RF pulse should be applied with a phase of the second half of the RF pulse waveform after the center thereof different by 180° from the phase of the first half of the same.

As a result of such irradiation control, a predetermined region along the central axis of an RF transmitting coil can be selectively excited, and slice selection can be attained without applying a slice selection gradient magnetic field conventionally used. Alternatively, by using a slice selection gradient magnetic field in combination, two-dimensional selective excitation becomes possible.

In the MRI apparatus of the present invention, the transmitting means is provided with a multiple array transmitting coil comprising multiple coils of different irradiation intensity profiles, and the RF irradiation control means performs such phase control for a part of the multiple coils that the phase of the second half of the RF pulse waveform after the center thereof should be different by 180° from the phase of the first half of the same.

The multiple array transmitting coil employed in the MRI apparatus of the present invention is provided with, for example, a loop coil and at least one differential coil. The differential coil is provided with multiple subloop coils, and the multiple subloop coils and the loop coil have a common central axis. The subloop coils are plane-symmetrically disposed around the loop coil as the center, and the subloop coils constituting the same differential coil are connected so that currents should flow through a pair of plane-symmetrically disposed subloop coils in different directions.

Further, in the multiple array transmitting coil employed in the MRI apparatus of the present invention, the differential coil may be provided with a primary differential coil and a secondary differential coil. The subloop coils of the primary differential coil may be disposed so that the loop coil should locate between the subloop coils of the primary differential coil, and the secondary differential coil may be disposed so that the loop coil and the subloop coils of the primary differential coil should locate between the subloop coils of the secondary differential coil.

In the MRI apparatus provided with the multiple array transmitting coil having such differential coils, the RF irradiation control means performs such phase control for a differential coil part of the multiple coils that the phase of the second half of the RF pulse waveform after the center thereof should be different by 180° from the phase of the first half of the RF pulse waveform.

In the aforementioned multiple array transmitting coil, irradiation intensity profile obtained by composing the irradiation intensity profiles of the loop coil, primary differential coil and secondary differential coil has a limited uniform region. Therefore a small region can be selectively excited without using a technique of the presaturation method or the like by using this RF coil as an irradiation coil and performing the aforementioned phase control. Moreover, by incorporating the secondary differential coil, the selectivity for the region to be excited can be improved.

In the MRI apparatus of the present invention, the RF irradiation control means may control the phase for the differential coils to be reversed in two times of measurement, and the image formation means may add the nuclear magnetic resonance signals obtained by two times of the measurement to reconstruct one image.

By adding measurement results of two times of the measurement performed with inverse irradiation phases, boundary of the excitation profile can be made shaper.

In addition, it is also possible to perform phase control only for the differential coils so that the phases of the RF pulse should different by 180° in two times of the measurement instead of performing phase control so that phases of the first half and second half of the RF pulse irradiation should be different by 180°, and add NMR signals obtained by two times of the measurement to reconstruct one image. Also in this case, the same effect can be obtained as the case where phase control is performed so that phases of the first half and second half of the RF pulse irradiation should be different by 180°.

Further, in the MRI apparatus of the present invention, the transmitting means may be provided with a first multiple array transmitting coil comprising a first loop coil and at least one differential coil having a common central axis and a second multiple array transmitting coil comprising a second loop coil and at least one differential coil having a common central axis, wherein the central axes of the first and second multiple array transmitting coil are perpendicular to each other.

Also in the MRI apparatus having such a configuration, an image of a selectively excited region can be obtained by performing RF transmission with phases different by 180° for the first half and second half of one time of RF pulse irradiation, by performing imaging with such phase control two times with inverse phases and adding NMR signals obtained by two times of the measurement to reconstruct one image, or by performing RF transmission with phases of RF pulses different by 180° in two times of measurement and adding NMR signals obtained by two times of the measurement to reconstruct one image.

By using this MRI apparatus, it is possible to attain selective excitation for two directions perpendicular to each other. Further, by choosing either one of the two loop coil groups, it is possible to attain selective excitation for a desired axial direction. Furthermore, by using this RF coil, an RF magnetic field can be irradiated or detected for two directions perpendicular to the magnetic field, and therefore it can be used as a QD coil.

In the MRI apparatus of the present invention, the loop coil may comprise multiple loop coils, and they may be plane-symmetrically disposed. With such a configuration, a region to be excited can be enlarged.

In the MRI apparatus of the present invention, phase control of the RF magnetic field enables selective excitation, and selective excitation using a gradient magnetic field can further be used in combination. That is, the control means of the MRI apparatus of the present invention performs selective excitation in the slice direction upon excitation by the multiple array transmitting coil. Alternatively, it performs selective excitation for the phase encoding direction or frequency encoding direction upon excitation by the multiple array transmitting coil.

Furthermore, in the MRI apparatus of the present invention, the multiple array transmitting coil can be used also as an RF receiving coil of the receiving means.

In the multiple array transmitting coil employed in the aforementioned MRI apparatus of the present invention, induction coupling of the loop coil and differential coils (primary differential coil and secondary differential coil) are eliminated (decoupled), and they operate independently. Therefore, when it is used as a receiving coil, parallel MRI can be efficiently performed, and multiple array coil composition is also possible.

That is, the control means of the MRI apparatus of the present invention performs imaging with thinning out (reducing) the phase encoding, and when an image is reconstructed by using nuclear magnetic resonance signals detected with each of the coils of the multiple array transmitting coil, the image formation means performs an anti-aliasing operation by using receiving sensitivity profile (henceforth also referred to as "sensitivity profiles") of each of the coils constituting the multiple array transmitting coil (parallel MRI).

Alternatively, the image formation means of the MRI apparatus of the present invention composes images reconstructed by using nuclear magnetic resonance signals detected by each of the coils of the multiple array transmitting coil to produce one image (multiple array coil composition, Mac composition).

When the RF transmitting coil also serves as an RF receiving coil as described above, selective excitation of a predetermined field of view (henceforth also referred to as "parallel transmission"), and parallel MRI in which measuring time is shortened by thinning out the encoding phase or Mac composition can be realized.

BRIEF EXPLANATION OF THE DRAWINGS

FIG. 15 illustrates data collection in parallel MRI.

BEST MODE FOR CARRYING OUT THE INVENTION

Hereafter, the RF coil and MRI apparatus of the present invention will be explained in detail with reference to the drawings.

Figure 1:
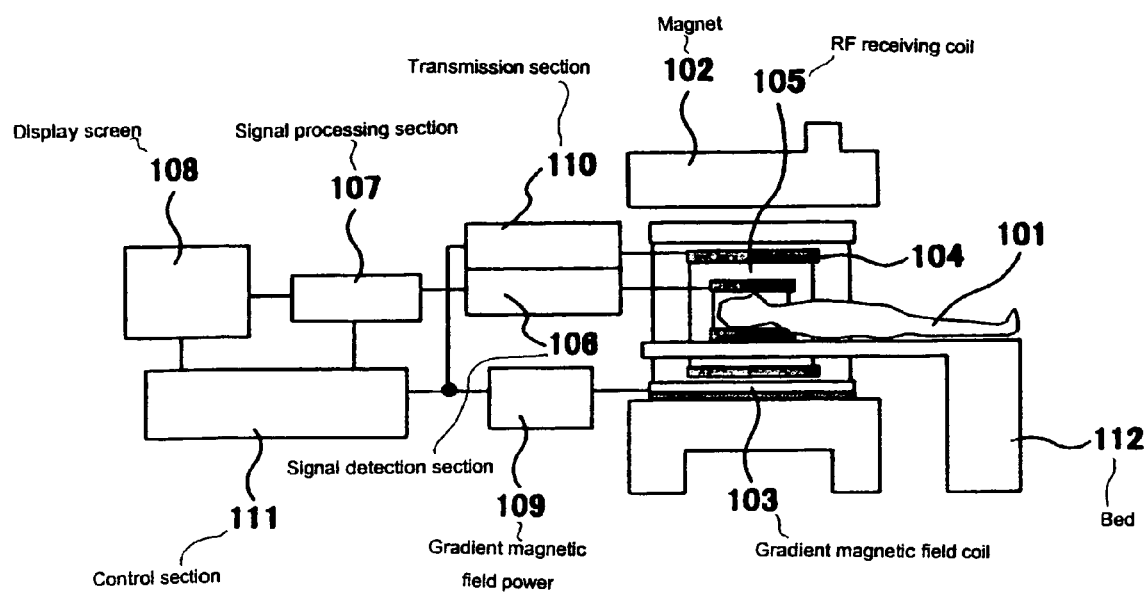
FIG. 1 shows an overall configuration of an MRI apparatus to which the present invention is applied.

FIG. 1 shows configuration of a typical MRI apparatus to which the present invention is applied. This MRI apparatus is provided with a magnet 102 for generating a static magnetic field in a space in which a subject 101 is placed, a gradient magnetic field coil 103 for generating a gradient magnetic field in the space, an RF transmitting coil 104 for generating a high frequency magnetic field, an RF receiving coil 105 for detecting NMR signals generated by the subject 101 and a bed 112 provided for the subject to lie thereon.

The magnet 102 comprises a permanent magnet, resistive type magnet or super-conductive magnet and generates a uniform static magnetic field in the space in which the subject 101 is placed. Although the apparatus shown in the drawing utilizes the vertical magnetic field method in which a static magnetic field is generated along the vertical direction, a horizontal magnetic field may also be used. The gradient magnetic field coil 103 comprises gradient magnetic field coils for the three kinds of directions X, Y and Z, and each of them generates a gradient magnetic field in accordance with current from a gradient magnetic field power supply 109. The RF transmitting coil 104 comprises multiple coils as described later, and generates a high frequency magnetic field in accordance with current from an RF transmission section 110. The signal of the RF receiving coil 105 is detected by a signal detection section 106, processed and converted into an image signal by calculation in a signal processing section 107. The image is displayed on a display screen 108.

The gradient magnetic field power supply 109, RF transmission section 110 and signal detection section 106 are controlled by a control section 111 in accordance with a time chart for control called pulse sequence. The control section 111 comprises a sequencer incorporated with a program for such control. Further, although not shown in the drawing, the apparatus is provided with input apparatuses such as keyboard and mouse for a user to input an imaging method and conditions therefore.

Although the RF transmitting coil 104 and the RF receiving coil 105 are constituted with independent coils in the MRI apparatus shown in FIG. 1, the RF transmitting coil 104 may also serve as the RF receiving coil 105. In such a case, a switching circuit is inserted between the RF transmission section 110 and the signal detection section 106.

Hereafter, the RF transmitting coil 104 employed in the MRI apparatus of the present invention will be explained. A preferred RF transmitting coil 104 employed in the MRI apparatus of the present invention comprises a multiple coil system including a loop coil and multiple differential coils plane-symmetrically disposed on the both sides of the loop coil. In this specification, the term "differential coil" is used to refer to the primary differential coil or the secondary differential coil described later, or used as a generic term referring to them.

Figure 2A:
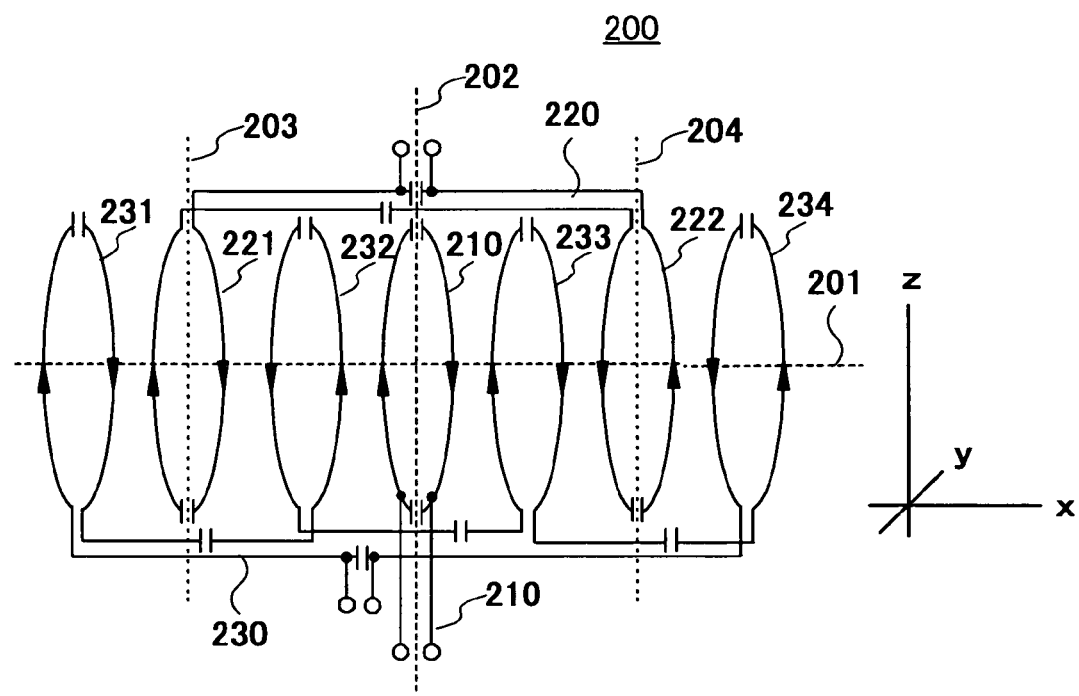
FIG. 2 shows an embodiment of the RF coil for MRI apparatus of the present invention.
Figure 2B:
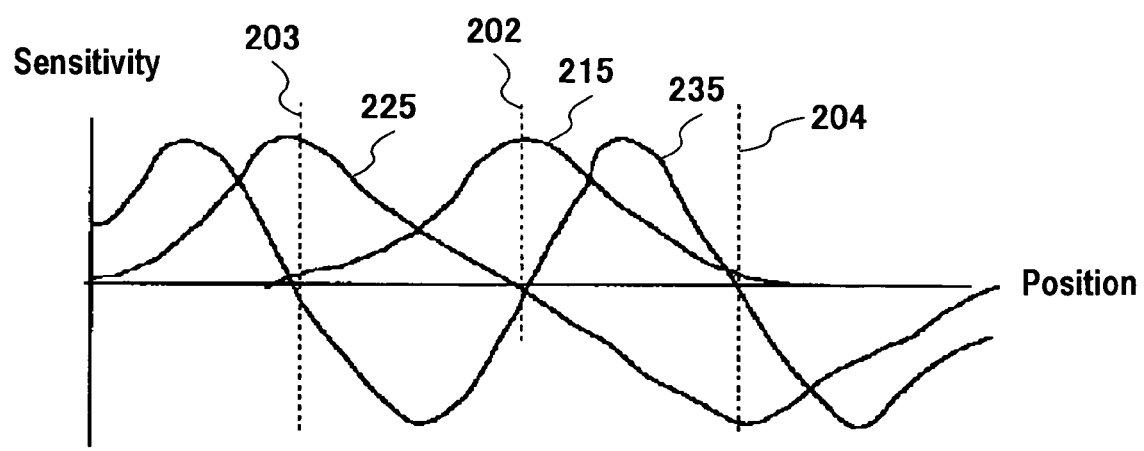

FIG. 2 shows an embodiment of such an RF coil according to the present invention. This RF coil 200 is a three-channel RF coil for a vertical magnetic field, and as shown in FIG. 2(*a*), comprises a loop coil 210 and two sets of differential coils 220 and 230 disposed along a direction perpendicular to the direction of the static magnetic field, which is designated z-direction in the coordinate system, for example, the direction of a common central axis 201 of the coils, i.e., x-direction. These loop coil 210 and differential coils 220 and 230 are each designed so as to cause parallel resonance at a resonant frequency of protons. When the static magnetic field intensity is 0.3 T, for example, the resonant frequency is 12.8 MHz. A rotating magnetic field generated by protons exists in the xy-plane, and the RF coil 200 mainly detects components of the x-direction among the directions.

The loop coil 210 is a solenoid coil of one turn placed at a plane 202 parallel to the zy-plane, and the sensitivity thereof represented by a curve 215 (receiving sensitivity profile or irradiation intensity profile) becomes the maximum at the plane 202 and decreases on the right and left sides of the plane along the x-direction as shown in FIG. 2(*b*). The differential coil 220 consists of a combination of two subcoils (solenoid coils) 221 and 222 plane-symmetrically disposed with respect to the loop coil 210, and connected so that currents may flow them along inverse directions. As a result, sensitivity of the differential coil 220 represented by a curve 225 becomes the maximum at the positions (planes) 203 and 204 of two of the solenoid coils 221 and 222 as an absolute value with inverse polarities and becomes zero at the plane 202 at which the loop coil 210 locates, as shown in FIG. 2(*b*). Therefore, the loop coil 210 and the differential coil 220 do not cause inductive coupling with each other, and they operate independently. That is, they are independent and decoupled in the sense of high frequency. Sensitivity of the differential coil 220 represented by the curve 225 has a profile corresponding to differential of the sensitivity of the loop coil 210 represented by the curve 215, and the differential coil 220 is generally called primary differential coil.

The differential coil 230 comprises four of subcoils (solenoid coils) 231, 232, 233 and 234 plane-symmetrically disposed with respect to the plane 202 and connected so that currents flow them in alternately inverse direction. Sensitivity of this differential coil 230 represented by a curve 235 becomes the maximum at the positions of four of the solenoid coils as an absolute value with alternately inverse polarities as shown in FIG. 2(*b*). Further, it shows no sensitivity at the planes 202, 203 and 204 at which the loop coil 210 and the primary differential coil 220 locate. Therefore, the loop coil 210 and differential coil 230, and primary differential coil 220 and differential coil 230 are not induced by each another, and operate independently. Sensitivity of the differential coil 230 represented by the curve 235 has a profile corresponding to differential of the sensitivity of the primary differential coil 220 represented by the curve 225, and the differential coil is called secondary differential coil in this specification.

As described above, three of the partial coils show sensitivity profiles different from one another, and inductive coupling with one another is essentially eliminated. Therefore, they can realize stable parallel MRI. Moreover, when they are used as an irradiation coil, they enable parallel transmission.

Although the solenoid coils constituting each of the differential coils 220 and 230 are connected in series in the drawing, they may be connected in parallel, so long as the directions of the currents flowing the solenoid coils 221 and 222 are inverse in the primary differential coil 220, and the directions of the currents flowing the solenoid coils 231, 232, 233 and 234 are alternately inverse in the secondary differential coil 230. In view of unlikeliness of being influenced from the circumferences including a subject and thus stability, the parallel connection is more desirable. Further, although mutual inductive coupling between the three partial coils is eliminated, a known decoupling method may also be used in combination in order to attain further stabilization. For example, the low impedance method, inductive decoupling method and so forth are preferred.

Figure 3:
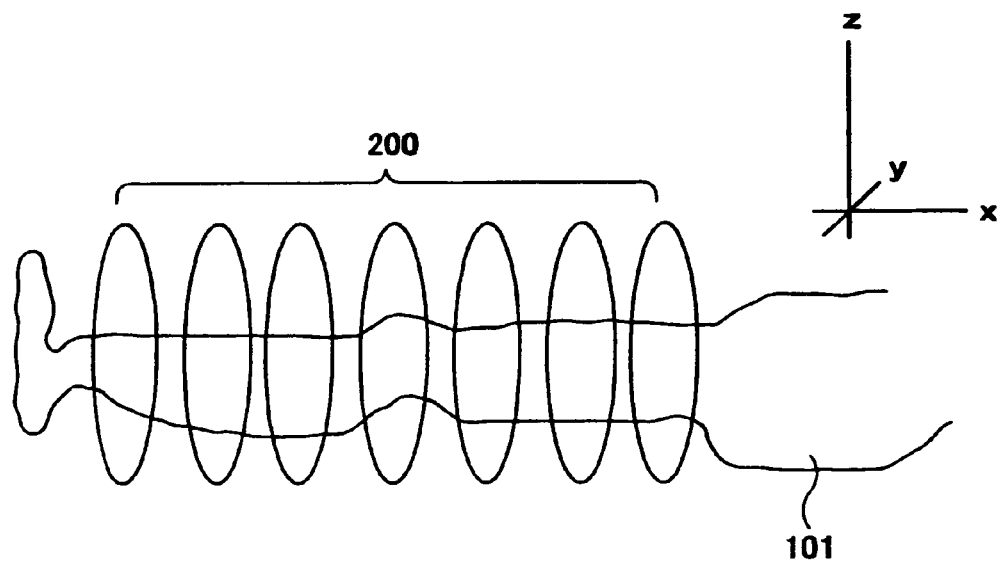
FIG. 3 shows an example of use of the RF transmitting coil of FIG. 2.

The RF coil of such a configuration is suitable for imaging of, for example, lower extremities and upper extremities as shown in FIG. 3. Further, if the loop coils have a larger size, they can also be used for imaging of thoracic or abdominal section.

Hereafter, an RF coil of a four-coil structure comprising a combination of two RF coils of different disposition directions will be explained as another embodiment of the RF coil employable in the MRI apparatus of the present invention. As shown in FIG. 4(*a*), the RF coil 400 includes a combination of an RF coil (loop coil group) 410 for irradiating or detecting an RF magnetic field mainly for the x-axis direction and an RF coil (loop coil group) 420 for irradiating or detecting an RF magnetic field mainly for the y-axis direction, relative to the z-axis direction as the direction of the static magnetic field.

Figure 4A:
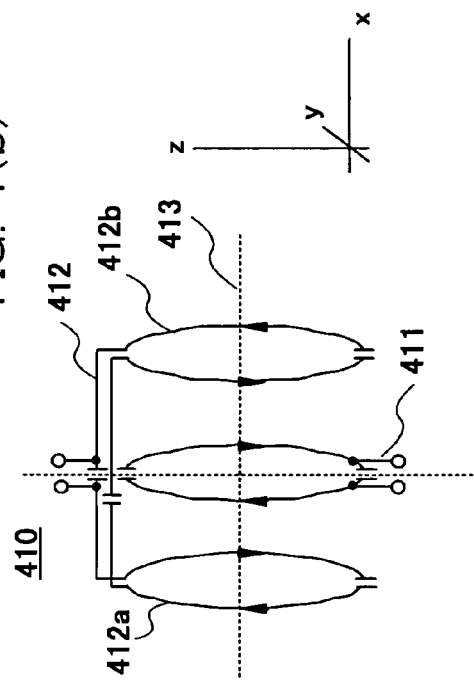
FIG. 4 shows another embodiment of the RF coil for MRI apparatus of the present invention.
Figure 4B:
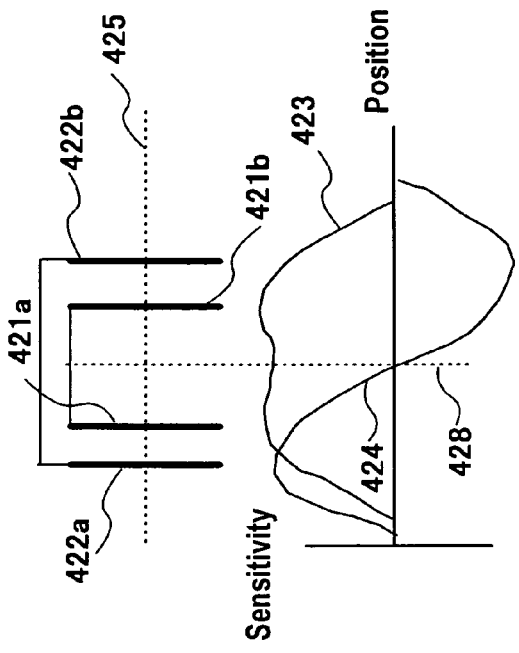

As shown in FIG. 4(b), the RF coil 410 is constituted by one loop coil 411 and differential coils 412 (412a, 412b) plane-symmetrically disposed on the both sides of the loop coil, which have a common central axis 413. This RF coil 410 has the same structure as that of the RF coil 200 shown in FIG. 2 except that the secondary differential coil is excluded, and the differential coils 412a and 412b on the both sides are connected so that the directions of the currents should be inverse to each other. Although two of the differential coils 412a and 412b are connected in series in the drawing, they may be connected in parallel so long as directions of the currents are inverse to each other.

Figure 4C:
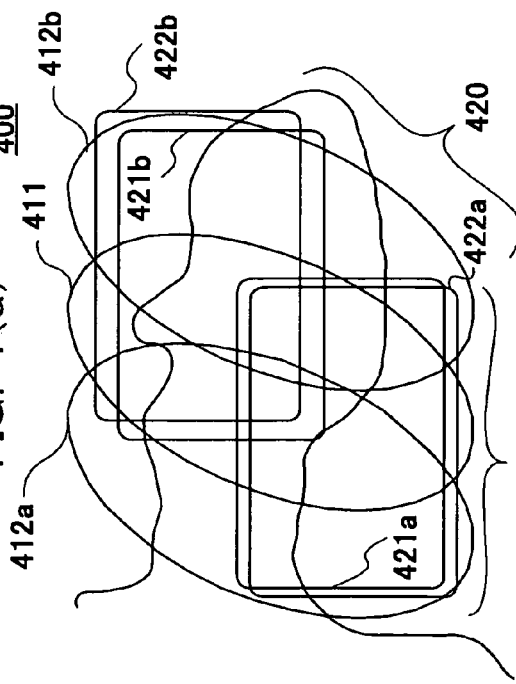

As shown in FIG. 4(c), the RF coil 420 are constituted by one set of loop coils 421 (421a, 421b) and differential coil 422 (422a, 412b) (four loop coils in total), which have a common central axis 425, and they are each plane-symmetrically disposed with respect to the plane 427 perpendicular to the central axis 425. Two of the loop coils 421a and 421b locating on the interior side among the four loop coils are connected so that the currents should flow along the same direction and constitute the loop coil 421. Although the loop coil 421 corresponds to the loop coil 411 located at the center of the RF coil 410, it is characterized by being constituted by a pair of coils. Two of the loop coils 422a and 422b locating on the exterior side are connected so that the currents should flow in inverse directions and constitute the differential coil 422. Although the loop coils 421a and 421b are connected in parallel in the drawing, they may be connected in series so long as the currents should flow in the same direction. Further, although the loop coils 422a and 422b constituting the differential coil 422 are connected in series, they may be connected in parallel so long as the currents should flow in inverse directions.

Figure 4D:
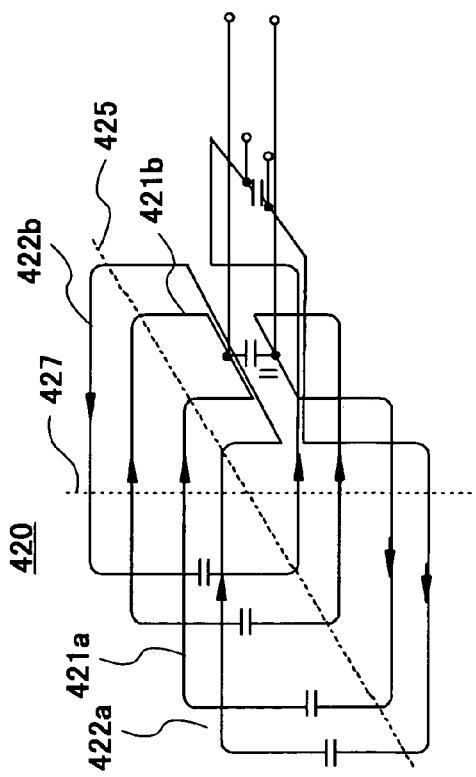

As shown in FIG. 4(d), the loop coil 421 has a flat and wide irradiation intensity profile represented by a curve 423, and the differential coil 422 has a narrow sensitivity profile represented by a curve 424 and shows sensitivity of 0 at the plane 428 and different polarities on the both sides of the plane. These loop coil 421 and differential coil 422 are independent from each other and do not interfere each other, because the volume integral of the product of the generated magnetic field and sensitivity profile is 0.

Also in the RF coil of this embodiment, the partial coils constituting each of the RF coils 410 and 420 have different sensitivity profiles, and inductive coupling between them is essentially eliminated. Therefore, they can realize stable parallel MRI. Moreover, when they are used as irradiation coils, parallel transmission is possible. Also for these RF coils, a known decoupling method such as the low impedance method and inductive decoupling method may be used in combination as required in order to attain further stabilization.

Although RF coil 400 shown in FIG. 4 is suitable as a coil for head as shown in FIG. 4(a), it can be used also as a coil for extremities or truncus, besides a coil for head.

The RF coils preferred for the MRI apparatus of the present invention have been explained above with reference to the embodiments shown in FIGS. 2 to 4. However, the RF coil used for the present invention is not limited to these embodiments, and various modifications may be added. For example, each solenoid coil constituting the RF coil of FIG. 2 may have multiple turns.

Hereafter, an MRI apparatus provided with a selective excitation function will be explained as an embodiment of the MRI apparatus of the present invention. This MRI apparatus uses a combination of multiple RF coils having different irradiation intensity profiles as the RF transmitting coil 104 and simultaneously drives these multiple coils to provide a specific excitation profile. As the multiple coil system, one comprising a plurality of partial coils each having different irradiation intensity profile and no magnetic coupling can be used, and for example, multiple coil systems having the structures shown in FIG. 2 and FIG. 4 are preferred.

Figure 5:
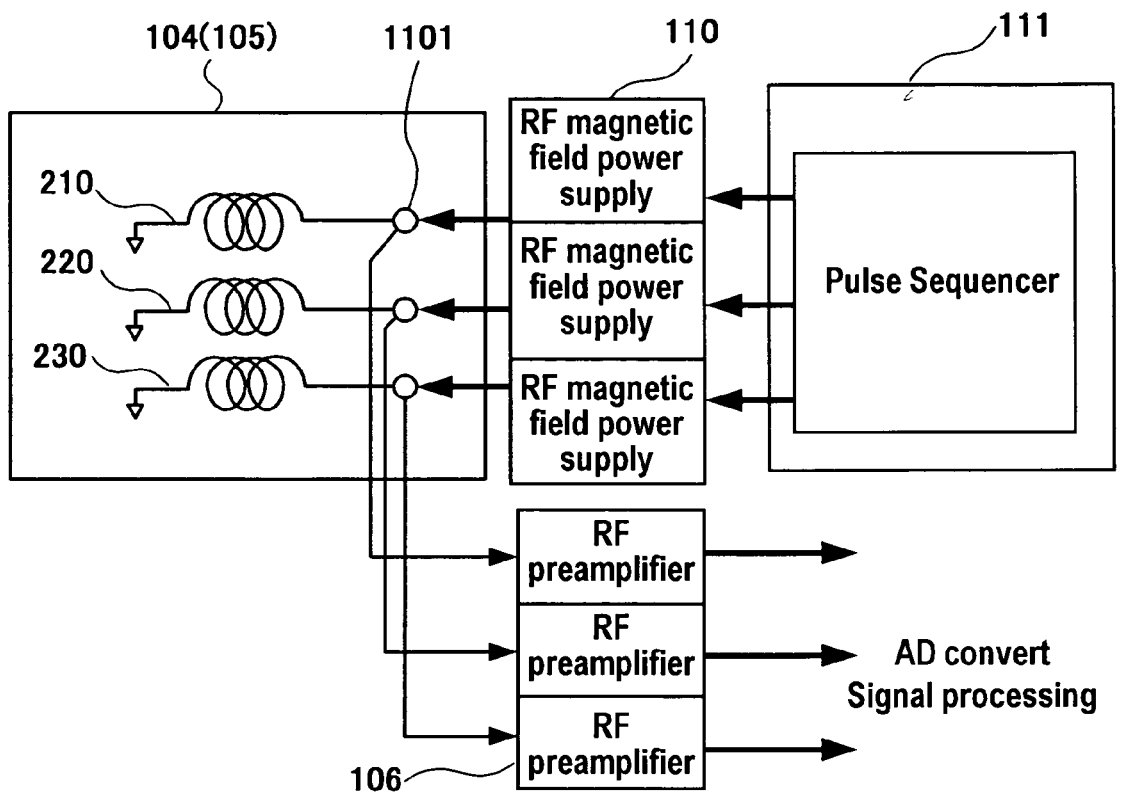
FIG. 5 shows connection between the RF transmitting coil and RF transmission section in the MRI apparatus of the present invention.

A configuration of an RF transmission section 110 using the multiple coil system shown in FIG. 2 is shown in FIG. 5. In the drawing, a connection scheme of the RF transmission section 110 using the RF transmitting coil 104 also serving as an RF receiving coil is shown as an example. However, it can also be used only as the RF transmitting coil 104. As shown in the drawing, the RF transmission section 110 is provided with RF magnetic field power supplies for driving RF coil 210, 220 and 230, respectively, and the RF coils 210, 220 and 230 are connected to RF magnetic field power supplies through known branch circuits 1101, respectively. The branch circuits 1101 send high output signals from the RF magnetic field power supplies to the RF coils and send low output signals from the RF coils to RF preamplifiers of the signal detection section 106. The RF magnetic field power supplies operate according to instructions from a pulse sequencer of a control section 111 and transmit RF signals to the RF transmitting coil 104 to simultaneously drive the RF coils with the same phase. Each of the signals received from the RF coils and amplified by the RF preamplifiers (signal detection section) 106 is subjected to A/D conversion and then used in known parallel MRI signal composition or multiple array coil composition in the signal processing section 107.

Figure 6:
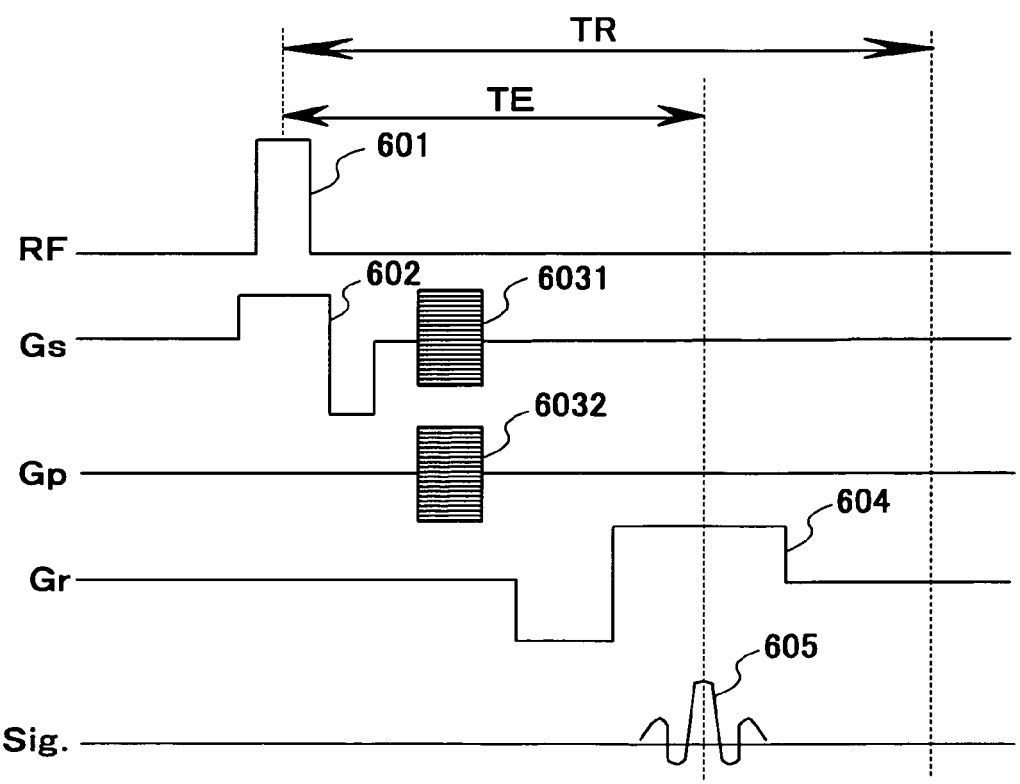
FIG. 6 shows an embodiment of the sequence used for parallel transmission according to the present invention.

Hereafter, the first embodiment of selective excitation imaging method using the MRI apparatus comprising such an RF transmitting coil 104 as described above will be explained. FIG. 6 shows a sequence based on a usual gradient echo method and applied with the parallel transmission MRI.

Figure 7:
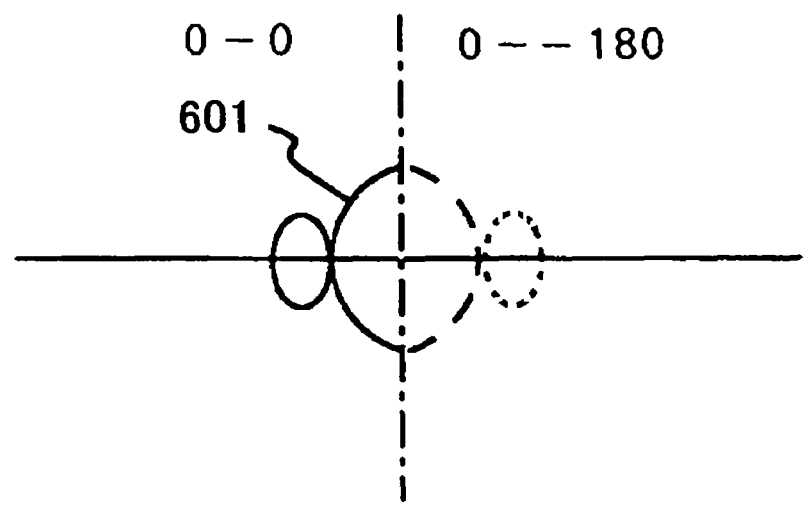
FIG. 7 shows an embodiment of the RF pulse used for the present invention.

In the selective excitation imaging method of this embodiment, an excitation pulse 601 is simultaneously transmitted from three of the coils of the aforementioned RF transmitting coil 104 (parallel transmission). In this transmission, the phase is changed during transmission of one RF pulse for the differential coils. Specifically, as shown in FIG. 7, the RF transmission is performed so that the RF coils 210, 220 and 230 constituting the RF transmitting coil 104 should perform the RF transmission with the same phases, i.e., 0-0, for the first half of the irradiation time of RF pulse 601 (the portion before the center indicated with a solid line), whereas, for the second half (the portion after the center indicated with a dotted line), the RF transmission should be performed with a phase changed by 180° only for the differential coils 220 and 230 and with the same phase as that of the first half for the loop coil 210. The other gradient magnetic fields (slice selection gradient magnetic field 602, slice encoding gradient magnetic field 6031, phase encoding gradient magnetic field 6032 and frequency encoding gradient magnetic field 604) are applied in the same manner as in a common gradient echo sequence, and a step of applying an RF pulse and measuring an echo signal 605 after an echo time TE is repeated for a required times while changing intensities of the slice encoding gradient magnetic field 6031 and the phase encoding gradient magnetic field 6032 to collect echo signals 605 in a number required to reconstruct an image.

The principle of selection of a desired region based on such phase control of RF pulse will be explained by referring to FIG. 8.

When the RF pulse 601 is simultaneously RF-transmitted from three of the coils of the RF transmitting coil 104, the sum of the signals generated from spins excited by each pulse is received by the RF receiving coil 105. If the flip angle of the RF pulse 601 is represented as $\alpha$, spins are inclined by $\alpha/2$ in the first half and further inclined by $\alpha/2$ in the second half, thus by an angle of $\alpha$ in total, by the irradiation of RF pulses described above at the central portion of the RF transmitting coil 104, and therefore desired excitation is attained. On the other hand, at the peripheral portion as for the axial direction of the RF transmitting coil 104, which is exposed to irradiation from the differential coils, spins are inclined by $\alpha/2$ in the first half and by $-\alpha/2$ in the second half, thus the spins are not eventually inclined, and no excitation is attained. Referring to FIG. 8, when the RF pulse is applied with the same phase by three of the RF transmitting coils, the excitation profile is as shown in FIG. 8(*a*), and when the pulse is applied with phase change of 180° only for the differential coils, the excitation profile is as shown in FIG. 8(*b*). If only the phase of the RF pulse applied to the differential coils is differed for the first half and the second half of the irradiation time as in this embodiment, when the first half is completed, i.e., at the center of the RF pulse, the excitation profile is as shown in FIG. 8(*a*), and after that, when the whole RF pulse is applied, the excitation profile finally becomes as indicated with a bold line in FIG. 8(*c*), which is a profile (profile shape) as if only the central portion along the central axis of the RF transmitting coil 104 is locally excited. That is, the echo 605 obtained by such phase control as described above is a signal from a region selected along the phase encoding direction Gp or along the frequency encoding direction Gr (direction of the central axis of the RF transmitting coil 104). With the sequence shown in FIG. 6, the slice gradient magnetic field 602 is applied upon the RF transmission, and the selection was made along the slice direction Gs. Therefore, two-dimensional selective excitation for the Gp-Gs plane or Gr-Gs plane is realized.

Thus, an echo signal from the selectively excited region can be obtained by one time of measurement using such an RF pulse. Although a case of three-dimensional measurement was shown in FIG. 6, it is similarly applied to two-dimensional imaging by setting the slice encoding number to 1.

The signal processing section 107 (FIG. 1) performs image reconstruction operations such as Fourier transformation for the echo signals 605 obtained by such RF phase control as described above and thereby converts the signals into image data, and an image is displayed on the display screen 108. When the RF transmitting coil also serves as an RF receiving coil, an image having no aliasing artifacts can be obtained with a small number of phase encoding by processing the signals from the multiple RF coils 210, 220 and 230 using parallel MRI technique. Thereby, advantages of both parallel transmission and parallel MRI can be obtained.

Figure 17A:
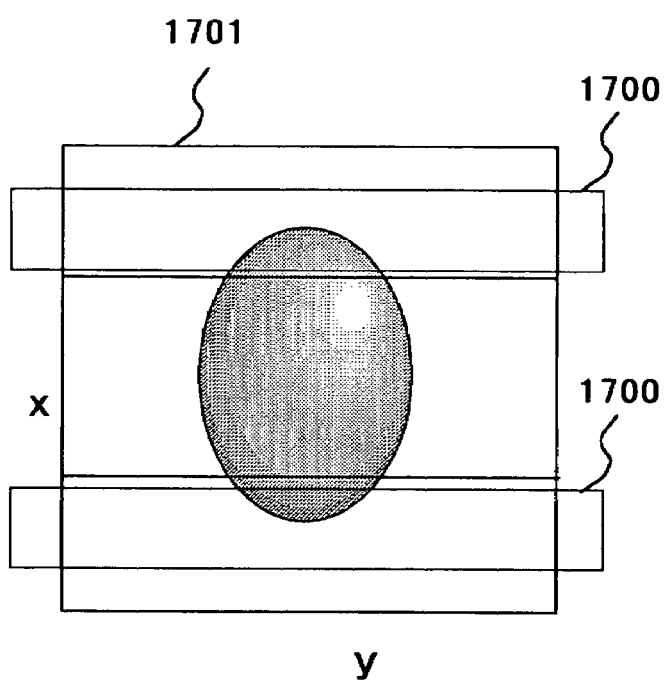
FIG. 17 illustrates the selective excitation according to the conventional presaturation method.
Figure 17B:
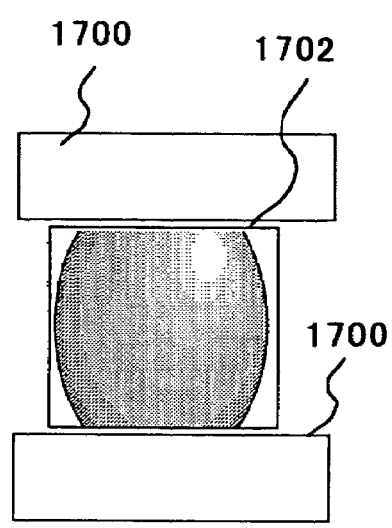

The results of imaging according to such selective excitation imaging are schematically shown in FIG. 9. FIG. 9(*a*) shows a result of imaging performed with a wide field of view 901 by using the aforementioned RF coil 104, (b) shows a result of imaging performed with a narrow field of view 904 by using the aforementioned RF coil 104, and (c) and (d) show results obtained by a conventional imaging method. When imaging is performed by the conventional imaging method with a wide field of view 901, a flow artifact is generated due to blood flow of a blood vessel 903 at a part of an ellipsoidal subject 902 in the phase encoding direction (vertical direction in the drawing) as shown in FIG. 9(*c*), and thus image quality is degraded. Further, when imaging is performed with a narrow field of view 904, an aliasing artifact 905 is generated due to signals outside the field of view in addition to the flow artifact. In order to suppress generation of such artifacts as described above, in the conventional techniques as show in FIG. 17, RF pulses are also irradiated on unnecessary portions 1700 to suppress signals from the unnecessary portions for both cases of a with field of view 1701(*a*) and narrow field of view 1702(*b*). On the other hand, in the selective excitation according to the present invention, because the RF transmitting coil 104 having a localized excitation profile is used, only a region 906 at the center along the x-direction is excited, signals on the both end sides are suppressed, and thus the blood flow artifact disappears to improve the image quality. Further, also when the imaging is performed with a small field of view, any aliasing artifact is not generated.

As described above, according to this embodiment, selective excitation of a local region can be easily attained with a sequence exactly the same as those used for existing techniques only by performing the control for differentiating the phase of the RF pulse for the first half and the second half of the irradiated waveform. This enables imaging and display of a small region with high speed, high resolution and suppressed artifacts.

Hereafter, the second embodiment of the MRI apparatus of the present invention will be explained. In this embodiment, the imaging of the first embodiment is repeated twice using inverse irradiation phases only for the differential coils, and by such an operation, edges (boundaries) of the excitation profile for the selected region can be made sharper.

That is, in each of two times of the measurement performed with the same encoding, during the transmission of the RF pulse 601, the RF pulse is applied to the differential coils 220 and 230, for the second half of the irradiation time, with a phase different by 180° from the phase for the first half of the irradiation time. Further, in the second measurement, the RF pulse is applied with a phase different by 180° from the phase for the first measurement only for the differential coils 220 and 230. Then, the echo signals obtained in the first and second measurements are added and used as data of the phase encoding.

More specifically, for example, the RF pulse for the first measurement is applied to the loop coil 210 and the differential coils 220 and 230 with a phase of 0° for all the coils in the first half of the irradiation time, and in the second half of the irradiation time, the RF pulse is applied to the loop coil 210 with the same phase, i.e., 0°, and to the differential coils 220 and 230 with a phase of 180° (i.e., different by 180° from that for the first half). Then, the RF pulse for the second measurement is applied to the loop coil 210 with the same phase, i.e., 0° and to the differential coils 220 and 230 with a phase of 180° (i.e., different by 180° from that for the first half of the first measurement) in the first half of the irradiation time, and in the second half of the irradiation time, the RF pulse is applied to the loop coil 210 with the same phase, i.e., 0°, and the differential coils 220 and 230 also with the same phase, i.e., 0° (i.e., different by 180° from that for the second half in the first measurement and different by 180° from that for the first half in the second measurement).

The signal processing section 107 (FIG. 1) adds the echo signals 605 obtained in two times of the measurement as described above, performs an image reconstruction operation such as Fourier transformation for the added echo signal to convert the signal into image data and display an image on the display screen 108.

By controlling the phase of the RF pulse as described above, the effect of the selective excitation according to the first embodiment and the effect of the selective excitation attained by two times of the measurement explained below are simultaneously expressed. Therefore, the boundary of the excited region and the non-excited region (that is, transitional region) in the excitation profile for the selected region can be narrowed to make the rising and falling of the profile steeper (sharper).

Hereafter, the third embodiment of the MRI apparatus of the present invention will be explained. The pulse sequence of FIG. 6 may be also employed as the pulse sequence for this embodiment. In this selective excitation imaging method, measurement is performed twice for the same encoding with differently performing the phase control, and the results of two times of the measurement are added to reconstruct one image. That is, in the first measurement, the excitation pulses 601 is simultaneously transmitted with the same phase by using the RF transmitting coil 104 comprising three of the aforementioned coils 210, 220 and 230 (parallel transmission). Unlike the first and second embodiments, the phase is not changed during the irradiation time for one time of irradiation. In the second measurement, the transmission is performed with a phase different by 180° from that for the first measurement only for the differential coils 220 and 230. The other gradient magnetic fields (slice selection gradient magnetic field 602, slice encoding gradient magnetic field 6031, phase encoding gradient magnetic field 6032 and frequency encoding gradient magnetic field 604) are applied in the same manner as a common gradient echo sequence.

Figure 8A:
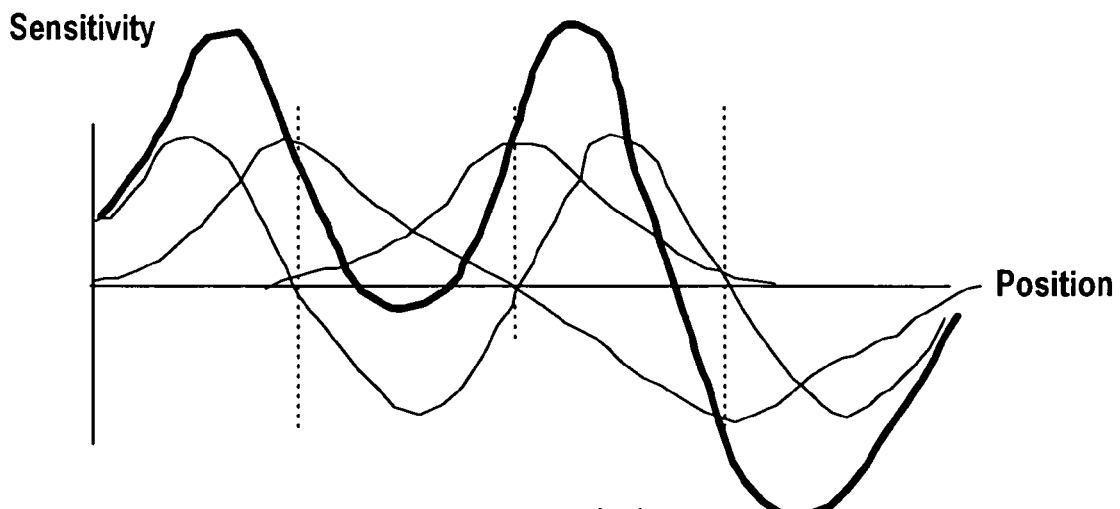
FIG. 8 illustrates the concept of selective excitation using the RF transmitting coil of FIG. 2.
Figure 8B:
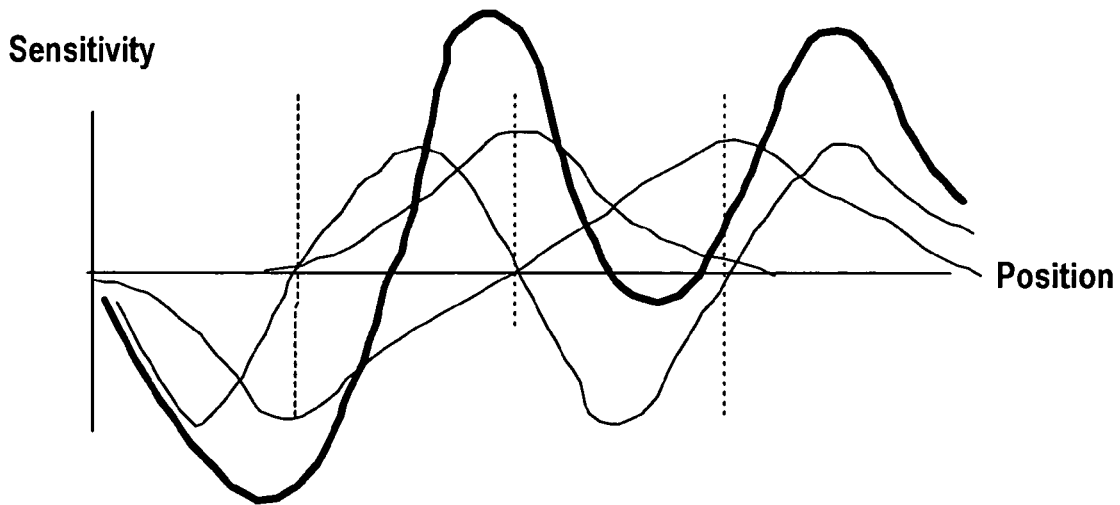
Figure 8C:
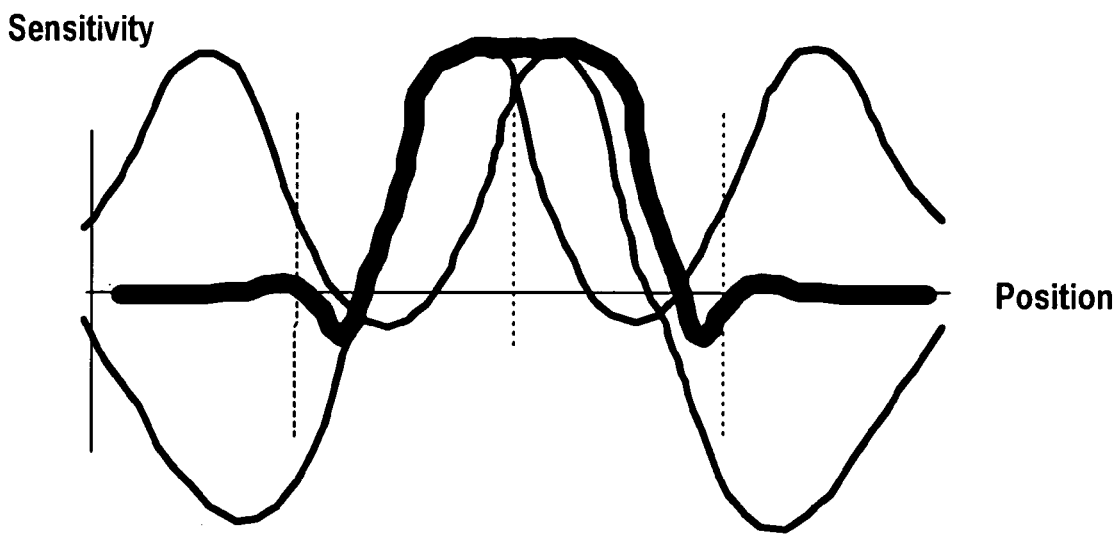
Figure 9A:
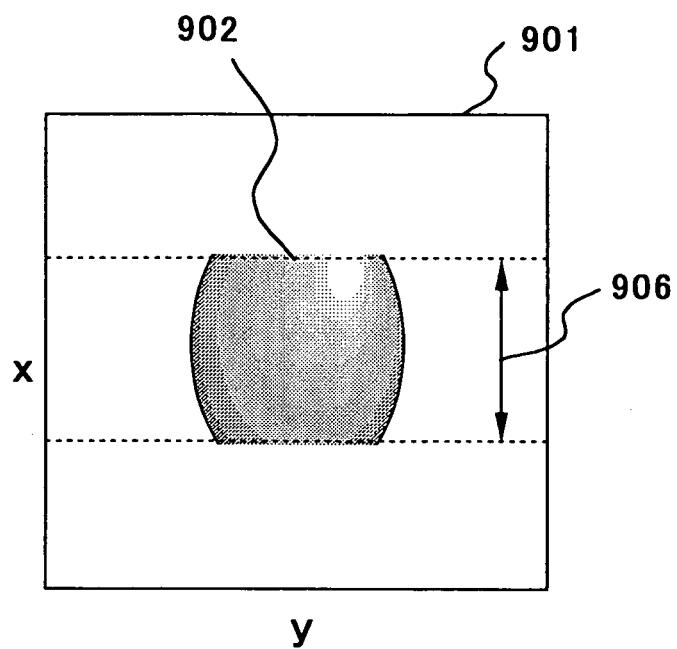
FIG. 9 shows an image obtained by parallel transmission according to the present invention and an image obtained by the conventional imaging method.
Figure 9B:
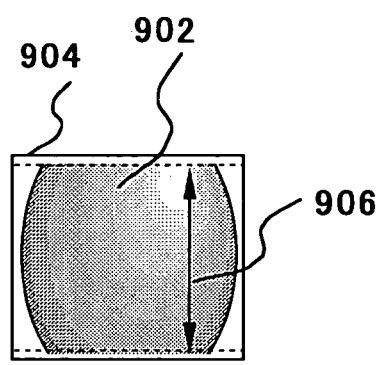
Figure 9C:
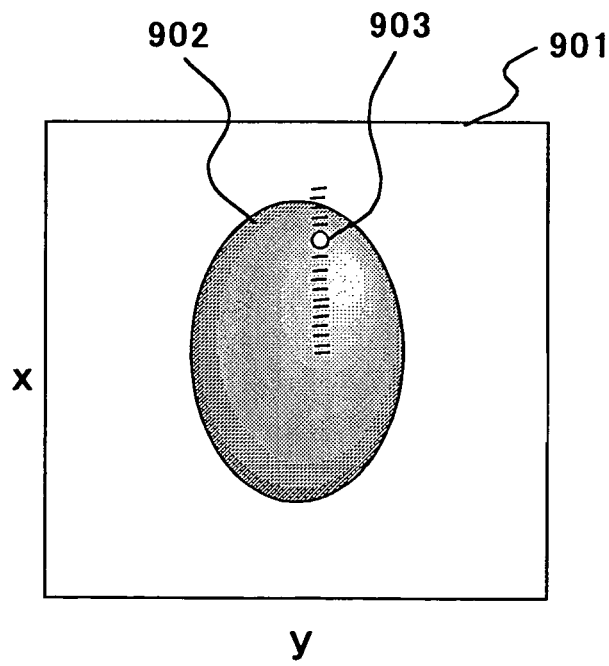
Figure 9D:
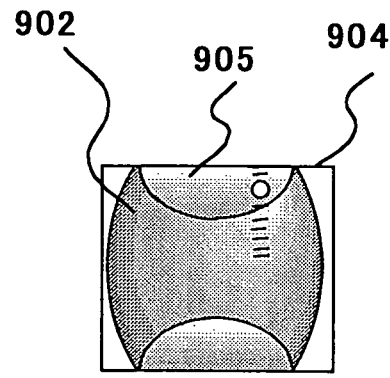

Also in this case, the excitation profile in the first measurement is as shown in FIG. 8(*a*) with a bold line, and the excitation profile in the second measurement is as shown in FIG. 8(*b*) with a bold line. The added signals obtained by one set of these measurements have such a profile as shown in FIG. 8(*c*) with a bold line.

Also in this embodiment, a small region can be imaged and displayed with high speed, high resolution and suppressed artifacts as in the aforementioned embodiments only by performing phase control of the RF pulse without changing the existing sequence.

In addition, although the third embodiment mentioned above was explained for a case where the respective signals obtained by two times of the measurement are added to produce single phase encoding data, it is also possible to measure total phase encoding data of a k-space with the same RF pulse phase (first imaging), then measure total phase encoding data of the k-space with an RF pulse phase different by 180° from the foregoing phase only for the differential coils (second imaging), and after these two times of measurement of the total phase encoding data, add the data for every phase encoding, or add images obtained from respective total phase encoding data.

Figure 10:
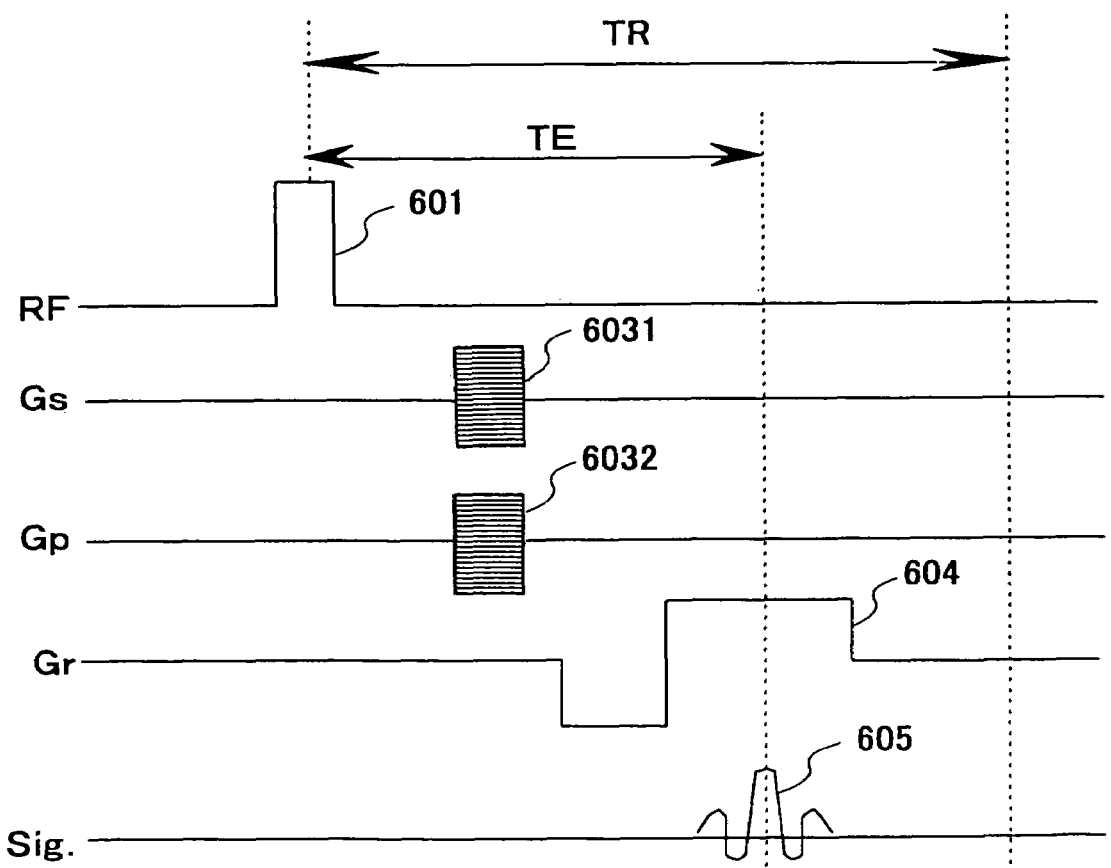
FIG. 10 shows another embodiment of the sequence used for parallel transmission according to the present invention.

Further, another excitation imaging method using an MRI apparatus comprising the RF transmitting coil of FIG. 2 will be explained as the forth embodiment. In this embodiment, the slice selection gradient magnetic field determining imaging sections is not used, and selective excitation is performed using the direction of the central axis of the RF transmitting coil (x-direction in FIG. 2) as the slice direction. A sequence used for such an embodiment is shown in FIG. 10. In the drawing, the same signs as those used in FIG. 6 are used for the same elements.

The sequence shown in FIG. 10 is the same as the sequence shown in FIG. 6 except that the slice selection gradient magnetic field to be applied simultaneously with the RF pulse 601 is excluded. Instead, in this embodiment, imaging is performed by using the direction of the central axis of the RF transmitting coil x-axis) as the slice direction. Also in this case, phase control is performed according to any one of the following schemes (1) the RF pulse 601 is irradiated with phases different by 180° for the first half and the second half of the irradiation time only for the differential coils, (2) imaging is performed twice by irradiating the RF pulse 601 with phases different by 180° for the first half and the second half of the irradiation time only for the differential coils, and the phases for the differential coils should be inverse in two times of the measurement, and (3) the first measurement is performed with the same phase of the RF pulse 601 for all the coils, the second measurement is performed with a phase different by 180° only for the differential coils, and echo signals obtained by two times of the measurement are added.

The profile of the signal obtained as a result of imaging using such phase control or addition of results from two times of measurement is a profile selected for the x-axis direction. The thickness and position of a thus selectively excited region (equivalent to a slice) are determined by size and position of the RF transmitting coil.

Because the imaging method of this embodiment is a method not applying the slice gradient magnetic field simultaneously with the RF pulse, it is particularly suitable for an MRI apparatus in which ununiformity of static magnetic field is relatively large. This is because, in usual imaging, the slice position is determined by the magnetic resonance frequency, which is determined by [static magnetic field intensity B0+slice gradient magnetic field intensity Gs], and therefore when the static magnetic field intensity B0 is spatially distorted, the slice plane is also distorted, whereas in this embodiment, the slice position is not substantially affected by the static magnetic field intensity, and therefore such distortion does not substantially occur. Further, because the slice gradient magnetic field is not applied either, imaging is not influenced by a magnetic field generated by an eddy current.

Although, as another embodiment of the MRI apparatus of the present invention, an MRI apparatus employing the RF coil shown in FIG. 2 as an RF transmitting coil and an embodiment of the selection imaging method using it have been explained, the RF transmitting coil is not limited to that shown in FIG. 2.

Hereafter, another embodiment of the RF transmitting coil employed in the MRI apparatus of the present invention will be explained.

Figure 11A:
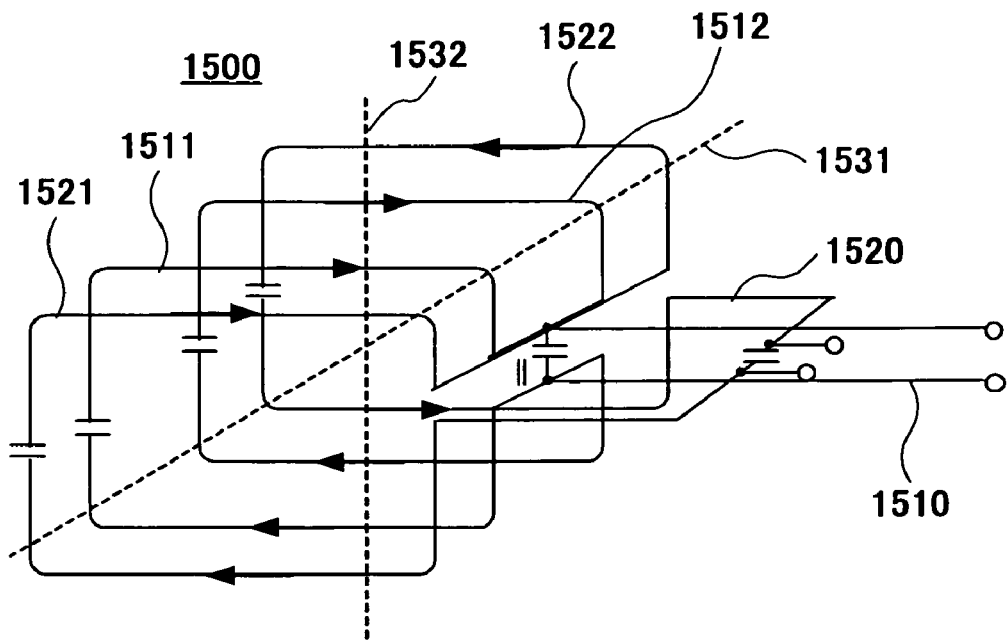
FIG. 11 shows another embodiment of the RF transmitting coil employed in the MRI apparatus of the present invention.
Figure 11B:
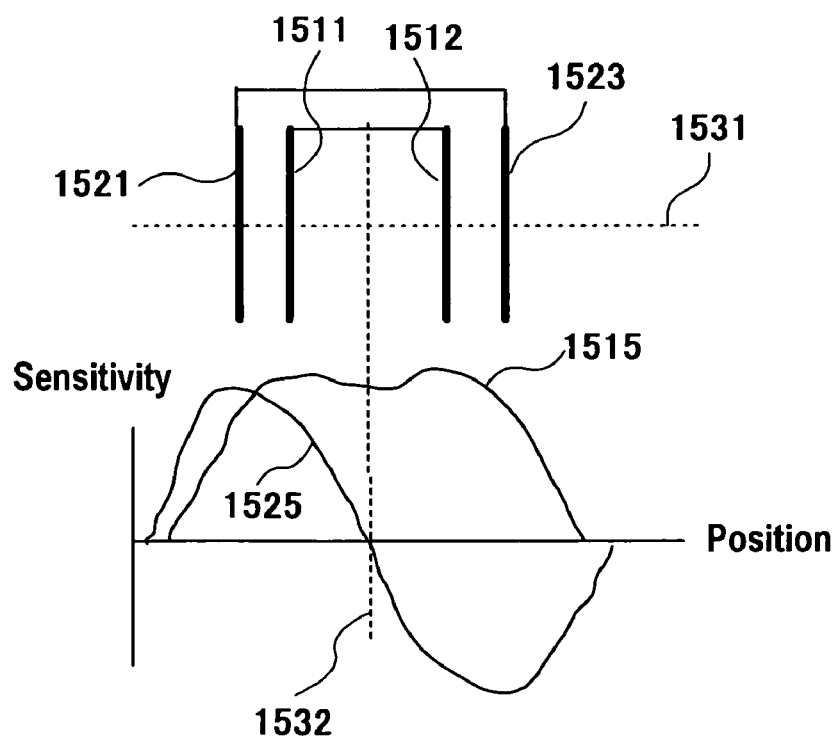

FIG. 11 shows another embodiment of the RF transmitting coil, and it has the same configuration as that of the RF partial coil 420 as one of the coils in the RF coil 400 shown in FIG. 4 (FIG. 4(*c*)). That is, this RF transmitting coil 1500 is constituted by two sets of RF partial coils 1510 and 1520 (four loop coils 1511, 1512, 1521 and 1522), which have a common central axis 1531 and are plane-symmetrically disposed with respect to the plane 1532 perpendicular to the central axis 1531. The RF partial coil 1510 has a flat and wide irradiation intensity profile represented by a curve 1515, and the RF partial coil 1520 has a sensitivity profile represented by a curve 1525, which is a narrow sensitivity profile in which sensitivity is 0 at the plane 1532 and has different polarities on the both sides of the plane, as shown in FIG. 11(*b*). These RF partial coils 1510 and 1520 are independent from each other and do not interfere each other, because the volume integral of the product of the generated magnetic field and sensitivity profile is 0. As will be seen on the analogy of the explanation of the selective excitation by the RF transmitting coil of FIG. 2 (FIG. 8), as a result of selective excitation according to the present invention using the RF transmitting coil 1500, an irradiation intensity profile which locally excites the central portion of the coil is obtained. Because this RF transmitting coil 1500 is not provided with a secondary differential coil, sharpness of an end (edge) of a region to be selected is inferior to that obtained with the RF transmitting coil of FIG. 2. However, because it has a configuration that a pair of loop coils 1511 and 1512 are disposed at the center with an interval, it is suitable for selective excitation of a region larger for the central axis direction compared with the RF transmitting coil of FIG. 2. Further, because two of the loop coils 1511 and 1512 can be disposed so that a region to be imaged should be between them, it has an advantage that they can be easily put on the subject.

In the RF transmitting coil 1500 shown in FIG. 11, a secondary differential coil may further be incorporated as required, and it may also be combined with another RF transmitting coil to realize parallel transmission.

Figure 12A:
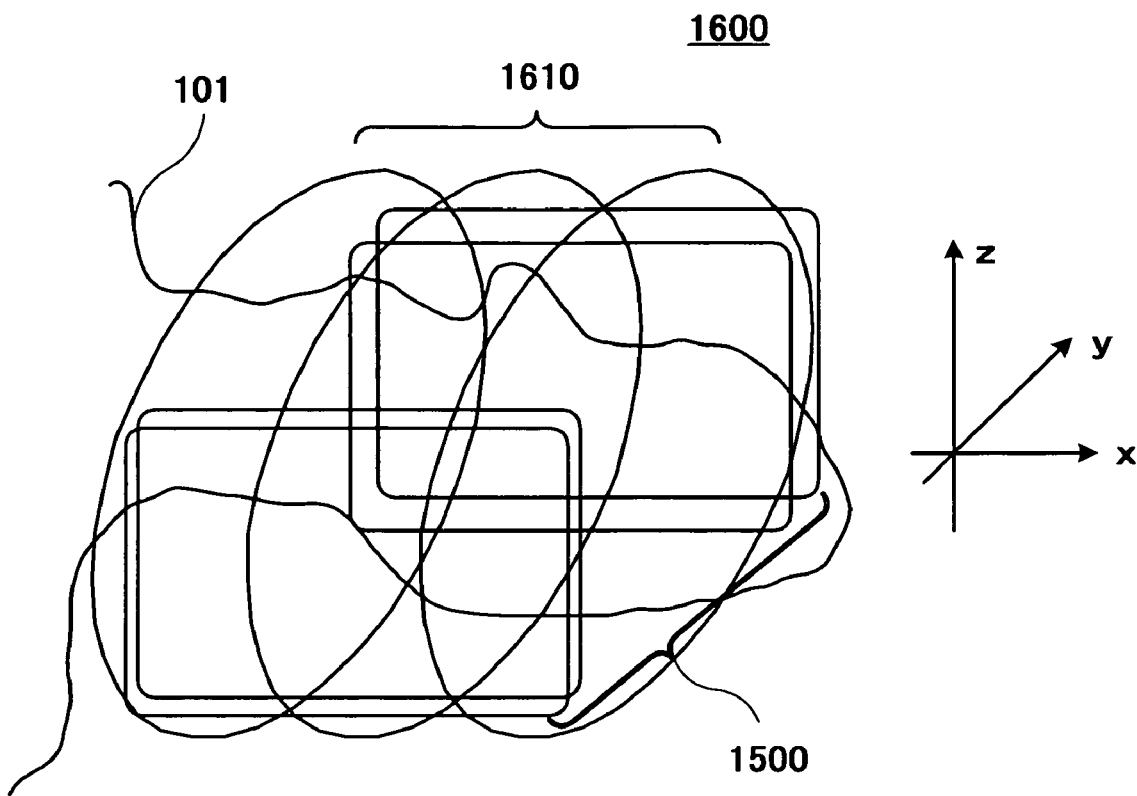
FIG. 12 shows another embodiment of the RF transmitting coil employed in the MRI apparatus of the present invention.
Figure 12B:
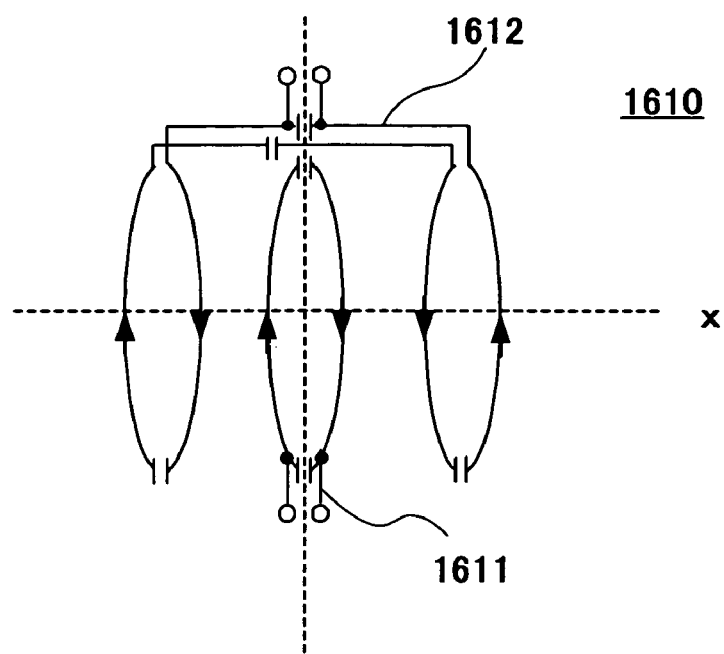

As shown in FIG. 12, for example, an RF coil 1600 identical to the RF coil shown in FIG. 4 can be constituted by combining an RF coil 1610 (FIG. 12(b)) comprising a loop coil 1611 and a differential coil 1612. This RF transmitting coil 1600 enables parallel imaging for two directions perpendicular to each other and selective parallel transmission for both of the x- and y-directions either. That is, by choosing the coil to be used, the direction of partial excitation can be changed. Further, by shifting the phases of RF irradiations by the RF coil 1610 and RF coil 1500 so that they should be different by 90°, the known QD irradiation also becomes possible. However, because the space selectivity of the RF irradiation decreases in such a case, it is preferable to use only the RF coil 1610 when selective irradiation is performed for the x-direction and to use only the RF coil 1500 when selective irradiation is performed for the y-direction in order to maintain the selectivity. Furthermore, if the RF transmitting coil 1600 used in this embodiment is also used as a receiving coil, multiple array synthesis and QD synthesis become possible as non-parallel imaging.

As describe mentioned above, embodiments of the RF transmitting coil for parallel transmission employed in the MRI apparatus of the present invention have been explained with reference to FIGS. 11 and 12. To these embodiments, various modifications can further be added as for the number of turns of the RF coils and the loop coil and so forth. For example, a tertiary differential coil may be added to the RF transmitting coil of FIG. 2, and by increasing the number of coils, selectivity for a region to be excited (sharpness of edge of irradiation intensity profile) can be improved. Further, it is also possible to use an RF transmitting coil of the three-coil structure shown in FIG. 2 in combination instead of the RF transmitting coil 1610 of the two-coil structure comprising the loop coil and differential coil used in the embodiment shown in FIG. 12.

Also with the RF transmitting coils of FIG. 11 and FIG. 12 including such modifications, a desired region along desired one or two axes can be selectively excited by executing a pulse sequence for selective excitation according to any one of the aforementioned first to fourth embodiments. Setup of the pulse sequence for selective excitation, a region (axis) to be excited and so forth can be arbitrarily determined by a user through use of an input apparatus provided in the control section 111.

Hereafter, a parallel imaging method for the case where the RF transmitting coil also serves as the RF receiving coil in the MRI apparatus of the present invention will be explained.

Figure 13:
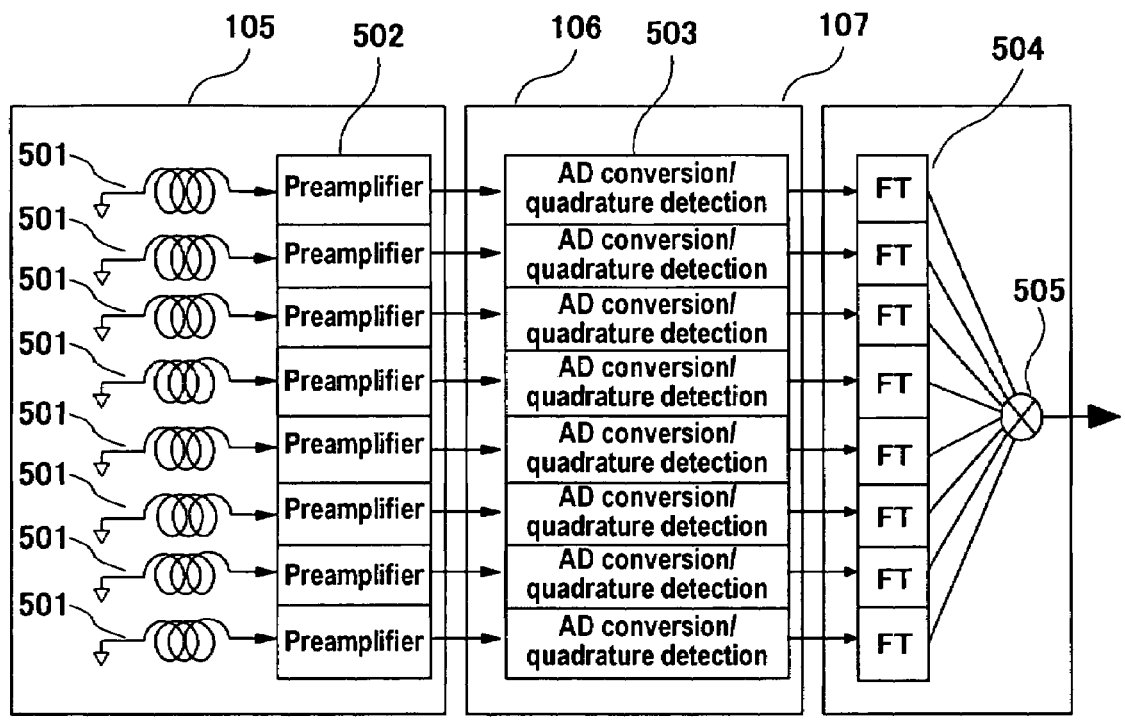
FIG. 13 shows the configuration of the RF receiving section of the MRI apparatus of the present invention.

Exemplary signal detection section 106 and signal processing section 107 of an MRI apparatus adopting a multiple coil system are shown in FIG. 13. In the example shown in the drawing, each of RF receiving coils 501 in a number of 8 at most is connected to a preamplifier 502 to constitute one multiple coil system 105. Further, in the signal detection section 106, eight A/D conversion/quadrature detection circuits 503 are connected in parallel and supplied with an output signal from each of the preamplifiers 502. The signal processing section 107 is provided with transducers 504 for performing Fourier transformation, back projection, wavelet transformation and so forth of signals from the A/D conversion/quadrature detection circuits 503 of the signal detection section 106 and a composing operation unit 505 for performing an image formation operation using signals detected by the RF receiving coils 501 and composition of signals of the calculated image. The composed image is displayed on the display screen 108 (FIG. 1).

Although the pulse sequence employed in parallel MRI is not particularly limited, a gradient echo sequence is employed, for example.

Figure 14:
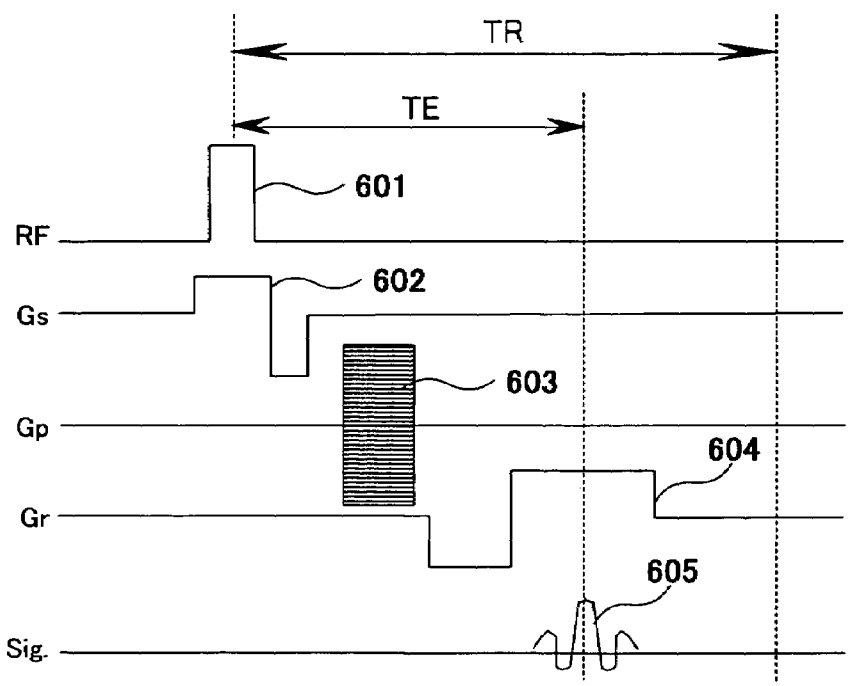
FIG. 14 shows an example of the sequence used for parallel MRI.
Figure 16:
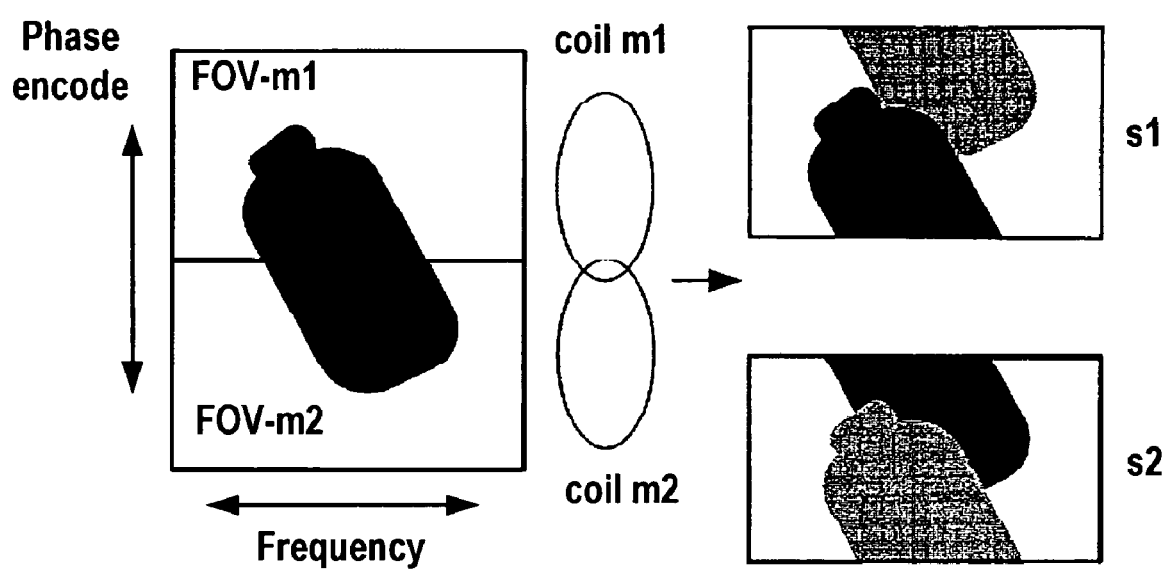
FIG. 16 illustrates the concept of parallel MRI.

FIG. 14 shows a usual gradient echo sequence. In the drawing, RF, Gs, Gp, Gr and Sig. represent application times of the high frequency pulse, slice selection gradient magnetic field pulse, phase encoding gradient magnetic field pulse and read-out gradient magnetic field pulse and acquisition time of echo signal, respectively, TE represents echo time, and TR represents repetition time.

First, a high frequency pulse 601 is applied simultaneously with the slice selecting gradient magnetic field 602 to excite a desired slice of a subject. Then, a phase encoding gradient magnetic field 603 is applied, a read-out gradient magnetic field 604 is applied to acquire an echo signal 605. While changing the intensity of the phase encoding gradient magnetic field 603, from the step of applying the high frequency pulse 601 to the step of obtaining the echo signal 605 are repeated with the repetition time TR to obtain echo signals of a phase encoding number required for image reconstruction.

As the number of phase encoding, a number of 64, 128, 256, 512 or the like is usually selected for one image, and each echo signal is usually obtained as a time series signal comprising 128, 256, 512 or 1024 sampling data. However, in the case of parallel MRI using a multiple RF coil system, the phase encoding step intervals are thinned out at a certain ratio to reduce the number of repetition time of imaging.

An echo signal measured by parallel MRI is shown in FIG. 15 in comparison with a signal obtained by usual imaging. FIG. 15(a) shows a signal obtained by imaging without thinning out step intervals, and signals 7021 to 7027 obtained with various phase encoding amounts are arranged in a k-space and used as data 701 for one image. The image reconstructed by Fourier transformation of the data 701 shown in FIG. 15(a) is an image 702 having no aliasing as shown in FIG. 15(c). On the other hand, FIG. 15(b) shows signals obtained by imaging with thinning out the data with a doubled phase encoding step interval. In this case, data 7041 to 7042 are obtained for every other line, and data for 7051 to 7054 are not measured. As a result, the amount of the measured data 703 becomes half, and if a matrix of a half size is used to reconstruct an image, an image 704 in which aliasings 705 are generated is obtained as shown in FIG. 15(d).

In the parallel MRI, for example, receiving sensitivity profile of each RF partial coil constituting the multiple RF coil system is obtained as reference data by preliminary measurement, and data generating aliasings, which are measured with thinning out the phase encoding, are developed by a matrix operation to eliminate aliasings. A specific procedure is described in, for example, "Signal Processing Method, "Sensitivity Encoding for Fast MRI", Klass P. Pruessmann et al., Magnetic Resonance in Medicine 42:952-962 (1999)".

Hereafter, an example of the anti-aliasing operation will be briefly explained. Although the imaging time can be shortened in the parallel MRI as divided by the number N of the coils (partial coils constituting multiple coil system) to (1/N) in principle, a case utilizing two coils will be explained below for simplicity.

First, if imaging fields of view are assigned to the coils and designated FOV-m1 and FOV-m2, and m1 and m2 are used as coil numbers, respectively, images calculated by using signals from each coil (element) are represented by the following equations (1) and (2).

$$Sij1 = Aij11 \cdot mij1 + Aij12 \cdot mij2 \quad (1)$$

$$Sij2 = Aij21 \cdot mij1 + Aij22 \cdot mij2 \quad (2)$$

In the equation (1), Sij1 represents an image calculated from the element m1, Aij11 represents sensitivity profile of the element m1 in FOV-m1, Aij12 represents sensitivity profile of the element m1 in FOV-m2, mij1 represents magnetization profile in FOV-m1, and mij2 represents magnetization profile in FOV-m2. In the equation (2), Sij2 represents an image calculated from the element m2, Aij21 represents sensitivity profile of the element m2 in FOV-m1, Aij22 represents sensitivity profile of the element m2 in FOV-m2, mij1 represents magnetization profile in FOV-m1, and mij2 represents magnetization profile in FOV-m2. Further, S, M, and A are matrixes of a size equal to the matrix sizes of FOV-m1 and FOV-m2. Further, the subscript letters i and j represent space coordinates.

Then, relative coil sensitivity profiles C1 and C2 for the imaging fields of view FOV are defined as the following equations (3) and (4), respectively.

$$Cij1 = Aij21 / Aij11 \quad (3)$$

$$Cij2 = Aij12 / Aij22 \quad (4)$$

On the basis of these equations (1) to (4), magnetization profiles weighted by the sensitivity profiles of the RF coils for the fields of view can be represented by the following equations (5) and (6), respectively. By placing the results of these equations (5) and (6) as juxtaposition, a total image having no aliasing can be obtained.

$$mij1 \cdot Aij11 = (Sij1 - Sij2 \cdot Cij2)/(1 - Cij1 \cdot Cij2) \quad (5)$$

$$mij2 \cdot Aij22 = (Sij2 - Sij1 \cdot Cij1)/(1 - Cij1 \cdot Cij2) \quad (6)$$

In the above, a case utilizing two coils and doubling the speed is explained for simplicity. However, this concept can also be applied to a case of utilizing three coils or four coils, and by increasing the number of the RF coils and thinning out the phase encoding to 1/3 or 1/4, high speed imaging of triple or quadruple speed is enabled. When the RF coil shown in FIG. 2 is used, the system has a three-coil structure, and therefore parallel triple speed is possible at most. In addition, when imaging is performed by using the RF coil shown in FIG. 2, it is sufficient to detect with three channels, and therefore only three outputs of the multiple coil system 105 shown in FIG. 13 may be used with turning off the other outputs.

As described above, according to the MRI apparatus of this embodiment, the sensitivity profiles of the multiple RF partial coils are significantly different for the phase encoding direction and independently operate, the anti-aliasing operation can be stably performed, and stable operation of parallel MRI can be attained. Thus, high speed and high precision imaging can be performed with a vertical magnetic field MRI apparatus.

Although both of parallel MRI and parallel transmission can be performed with the MRI apparatus of the present invention by employing a multiple array coil comprising coils of different sensitivity profiles as described above, it can also be applied to imaging without performing parallel MRI, and for example, it enables Mac (multiple array coil) composition in non-parallel imaging. Further, when the RF coil shown in FIG. 2 is used as an RF receiving coil, it can also be applied to a known signal composition method (for example, SMASH method). In the SMASH method, signal processing is usually performed after composing signals between coils and obtaining sensitivity profile shapes of primary and secondary differential coils. However, because the sensitivity profile of each RF coil in the aforementioned coil originally has a shape of primary differential or secondary differential, the amount of operation is extremely small, and thus the coil is particularly suitable for high-speed real time imaging.

Furthermore, the RF coil of FIG. 4 also has a characteristic that it can perform the QD composition in non-parallel imaging and has high sensitivity. Because two of the coils disposed at the center (411 and 421) have a shape substantially the same as that of a usual QD coil, a wide field of view can be obtained with uniform sensitivity. That is, a high quality and high uniformity of image can be realized with the loop coils 411 and 421 disposed at the center, and stable anti-aliasing operation is enabled by the differential coils 412 and 422.

As described above, according to the present invention, every RF partial coil constituting multiple coil system can be used in various manners with a definite purpose thereof.

According to the present invention, an MRI apparatus provided with an RF phase control means enabling selective excitation is provided. With this MRI apparatus, a small region can be imaged in a short time, and a stable image can be obtained without artifact or image quality degradation. Further, according to the present invention, an RF coil suitable for parallel MRI and parallel transmission and an MRI apparatus provided with the same are provided.

The invention claimed is:

1. A magnetic resonance imaging apparatus configured for imaging a selected portion of a subject placed in a static magnetic field, said magnetic resonance imaging apparatus comprising RF transmitting means for applying an RF excitation pulse to said subject an RF irradiation control means for controlling irradiation phase of the RF excitation pulse, RF receiving means for detecting nuclear magnetic resonance signals generated from the subject, a control means for controlling the RF transmitting means, the RF irradiation control means and the RF receiving means, and an image formation means for reconstructing an image of said selected portion of the subject by using the nuclear magnetic resonance signals, said RF transmitting means including a first coil and one or more additional coils, wherein the RF irradiation control means controls RF irradiation so that the RF excitation pulse is simultaneously applied to each of said first RF excitation coil and said one or more additional RF excitation coils such that within a single simultaneously applied RF excitation, a phase of a second half of a waveform of an RF excitation output of at least one of said first coil and said one or more additional RF excitation coils, after the temporal center of the simultaneously applied RF excitation pulse, is maintained to be held different by 180° from a phase of the first half of the pulse waveform, of the RF excitation output, such that the RF excitation is selectively applied only to a local region of the selected portion of the subject.

2. The magnetic resonance imaging apparatus according to claim 1, wherein the RF transmitting means is provided with a multiple array RF transmitting coil comprising multiple RF excitation coils of different sensitivity profiles, and the RF irradiation control means performs such phase control for a part of the multiple RF excitation coils that the phase of the second half of the RF pulse waveform after the temporal center thereof, is maintained continuously different by 180° from the phase of the first half of the RF excitation pulse waveform.

3. The magnetic resonance imaging apparatus according to claim 2, wherein the multiple array RF transmitting coil is provided with a RF loop coil and at least one RF differential coil, the RF differential coil is provided with multiple RF subloop coils, the multiple RF subloop coils and the RF loop coil have a common central axis, the RF subloop coils are plane-symmetrically disposed around the RF loop coil as the center, and the RF subloop coils constituting the same RF differential coil are connected so that currents should flow through a pair of plane-symmetrically disposed RF subloop coils in different directions.

4. The magnetic resonance imaging apparatus according to claim 3, wherein the RF differential coil is provided with a primary RF differential coil and a secondary RF differential coil, the RF subloop coils of the primary RF differential coil are disposed so that the RF loop coil is located between the RF subloop coils of the primary RF differential coil, and the RF subloop coils of the secondary RF differential coil are disposed so that the RF loop coil and the RF subloop coils of the primary RF differential coil are located between the RF subloop coils of the secondary RF differential coil.

5. The magnetic resonance imaging apparatus according to claim 2, wherein the RF transmitting means is provided with, as RF transmitting coils, a first multiple array RF transmitting coil comprising a first RF loop coil and at least one RF differential coil having a common central axis and a second multiple array RF transmitting coil comprising a second RF loop coil and at least one RF differential coil having a common central axis, and the central axes of the first and second multiple array RF transmitting coil are perpendicular to each other.

6. The magnetic resonance imaging apparatus according to claim 3, wherein the RF loop coil comprises plane-symmetrically disposed multiple RF loop coils.

7. The magnetic resonance imaging apparatus according to claim 3, wherein the RF irradiation control means performs such phase control for the RF differential coil among the multiple RF excitation coils that the phase of the second half of the RF excitation pulse waveform after the temporal center thereof, is maintained continuously different by 180° from the phase of the first half of the RF excitation Pulse waveform.

8. The magnetic resonance imaging apparatus according to claim 7, wherein the RF irradiation control means performs such phase control for the RF differential coil that the phase is an inverse in two times of measurement, and the image formation means adds nuclear magnetic resonance signals obtained by said two times of the measurement in order to reconstruct one image.

9. The magnetic resonance imaging apparatus according to claim 1, wherein the control means performs selective excitation of the slice direction upon excitation by application of an RF magnetic field.

10. The magnetic resonance imaging apparatus according to claim 1, wherein the control means performs selective excitation of the phase encoding direction or frequency encoding direction upon excitation by application of an RF magnetic field.

11. The magnetic resonance imaging apparatus according to claim 3, wherein the multiple array RF transmitting coil is used also as an RF receiving coil of the RF receiving means.

12. The magnetic resonance imaging apparatus according to claim 11, wherein the control means performs imaging with thinning out the phase encoding, and when an image is reconstructed by using nuclear magnetic resonance signals detected by each of the RF excitation/reception coils of the multiple array RF transmitting/receiving coil, the image formation means performs an anti-aliasing operation by using a sensitivity profile of each of the RF excitation/reception coils constituting the multiple array RF transmitting coil.

13. The magnetic resonance imaging apparatus according to claim 11, wherein the image formation means composes images reconstructed by using nuclear magnetic resonance signals detected by each of the RF excitation/reception coils of the multiple array RF transmitting/receiving coils in order to produce one image.

14. The magnetic resonance imaging apparatus according to claim 11, wherein the RF excitation pulse is applied without a slice selection gradient magnetic field being applied simultaneously.

15. The magnetic resonance imaging apparatus according to claim 1, wherein said first RF excitation coil operates independently, and is decoupled, from said additional RF excitation coils.

16. The magnetic resonance imaging apparatus according to claim 1, wherein said additional RF excitation coils are differential coils configured such that when the RF excitation pulse is simultaneously applied to each of said RF excitation first coil and said additional RF excitation coils, the phase of the first half of the waveform of an RF excitation output of said additional RF excitation coils is the same as a phase of a waveform of an RF excitation output of said first coil, and the phase of the second half of the waveform of the RF excitation output of said additional coils is maintained to be held different by 180° from the phase of the waveform of the RF excitation output of said RF excitation first coil.

17. A magnetic resonance imaging apparatus configured for imaging a selected portion of a subject placed in a static magnetic, field, said magnetic resonance imaging apparatus comprising:
an RF transmission section configured to apply an RF excitation pulse through a RF excitation first coil and one or more additional RF excitation coils to said subject;
receiving means configured to detect nuclear magnetic resonance signals generated from the subject,
a control section configured to control an irradiation phase of the RF excitation pulse and control the RF transmission section and the RF receiving means, and
a signal processing section configured to reconstruct an image of said selected portion of the subject by using the nuclear magnetic resonance signals,
wherein the control section controls RF irradiation so that the RF excitation pulse is simultaneously applied to each of said RF excitation first coil and said one or more additional RF excitation coils, such that within a single simultaneously applied RF excitation, a phase of a second half of a waveform of an RF excitation output of at least one of said RF excitation first coil and said one or more additional RF excitation coils, after the temporal center of the simultaneously applied RF excitation pulse, is maintained to be held different by 180° from a phase of the first half of the RF excitation output waveform, such that RF excitation is selectively applied only to a local region of the selected portion of the subject.

* * * * *